US009842789B2

(12) United States Patent
Kang et al.

(10) Patent No.: US 9,842,789 B2
(45) Date of Patent: Dec. 12, 2017

(54) ELECTRONIC COMPONENT PACKAGE AND METHOD OF MANUFACTURING THE SAME

(71) Applicant: SAMSUNG ELECTRO-MECHANICS CO., LTD., Suwon-si (KR)

(72) Inventors: Seung On Kang, Suwon-si (KR); Woo Sung Han, Suwon-si (KR); Young Gwan Ko, Suwon-si (KR); Chul Kyu Kim, Suwon-si (KR); Han Kim, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/140,775

(22) Filed: Apr. 28, 2016

(65) Prior Publication Data

US 2016/0336249 A1    Nov. 17, 2016

(30) Foreign Application Priority Data

May 11, 2015   (KR) .................. 10-2015-0065507
Sep. 17, 2015   (KR) .................. 10-2015-0131398

(51) Int. Cl.
*H01L 23/02*     (2006.01)
*H01L 23/31*     (2006.01)
(Continued)

(52) U.S. Cl.
CPC .......... *H01L 23/3128* (2013.01); *H01L 23/16* (2013.01); *H01L 23/36* (2013.01); *H01L 23/5389* (2013.01); *H01L 23/552* (2013.01); *H01L 24/19* (2013.01); *H01L 24/20* (2013.01); *H01L 24/96* (2013.01); *H01L 24/97* (2013.01); *H01L 23/295* (2013.01); *H01L 23/3677* (2013.01); *H01L 23/49816* (2013.01); *H01L 2224/04105* (2013.01); *H01L 2224/12105* (2013.01); *H01L 2924/145* (2013.01); *H01L 2924/1431* (2013.01); *H01L 2924/1432* (2013.01); *H01L 2924/1433* (2013.01); *H01L 2924/1436* (2013.01); *H01L 2924/1438* (2013.01); *H01L 2924/14335* (2013.01);
(Continued)

(58) Field of Classification Search
CPC . H01L 2924/15153; H01L 2924/16152; H01L 24/33; H01L 23/49805
USPC ........ 257/678, 688, 698, 778; 438/106, 125, 438/127
See application file for complete search history.

(56) References Cited

U.S. PATENT DOCUMENTS 7,126,210 B2 *   10/2006   Chiu ................ H01L 23/13
                                                     257/667
7,528,482 B2      5/2009    Huang et al.
(Continued)

FOREIGN PATENT DOCUMENTS

JP         2008-153393 A      7/2008

*Primary Examiner* — S. V. Clark
(74) *Attorney, Agent, or Firm* — McDermott Will & Emery LLP

(57) ABSTRACT

An electronic component package includes a frame having a cavity, an electronic component disposed in the cavity of the frame, a first metal layer disposed on an inner wall of the cavity of the frame, an encapsulant encapsulating the electronic component, and a redistribution layer disposed below the frame and the electronic component.

12 Claims, 18 Drawing Sheets

(51) Int. Cl.
*H01L 23/16* (2006.01)
*H01L 23/552* (2006.01)
*H01L 23/00* (2006.01)
*H01L 23/36* (2006.01)
*H01L 23/538* (2006.01)
*H01L 23/29* (2006.01)
*H01L 23/367* (2006.01)
*H01L 23/498* (2006.01)

(52) U.S. Cl.
CPC .............. *H01L 2924/19041* (2013.01); *H01L 2924/19042* (2013.01); *H01L 2924/19043* (2013.01); *H01L 2924/19105* (2013.01); *H01L 2924/3025* (2013.01); *H01L 2924/3511* (2013.01)

(56) References Cited

U.S. PATENT DOCUMENTS 8,546,183 B2 10/2013 Huang et al.
8,736,033 B1* 5/2014 Chuo .................... H01L 23/552
257/659

\* cited by examiner

II - II'

III-III'

IV-IV'

2

ELECTRONIC COMPONENT PACKAGE AND METHOD OF MANUFACTURING THE SAME

CROSS-REFERENCE TO RELATED APPLICATION

This application claims benefit of priorities to Korean Patent Application No. 10-2015-0065507, filed on May 11, 2015 and Korean Patent Application No. 10-2015-0131398, filed on Sep. 17, 2015 with the Korean Intellectual Property Office, the disclosure of which is incorporated herein by reference in its entirety.

BACKGROUND

1. Field

The present disclosure relates to an electronic component package and a method of manufacturing the same.

2. Description of Related Art

An electronic component package technology is a package technology for electrically connecting an electronic component to a printed circuit board (PCB), such as a main board of an electronic device, or the like, and protecting the electronic component from external impacts, and is distinguished from technology for embedding an electronic component in a printed circuit board, such as an interposer board. Meanwhile, recently, one main trend of developing technology associated with electronic components is to decrease a component size. Therefore, in a package field, in accordance with a rapid increase in demand for a small-sized electronic component, or the like, a package having a number of pins while having a small size has been required.

One of package technologies suggested in order to satisfy the technical requirements as described above is a wafer level package (WLP) technology using redistribution of an electrode pad of an electronic component formed on a wafer. As a wafer level package (WLP), there are a fan-in wafer level package (fan-in WLP) and a fan-out wafer level package (fan-out WLP). In particular, the fan-out WLP may be useful for implementing a number of pins while having a small size, and thus, recently, the fan-out WLP has been actively developed.

SUMMARY

Meanwhile, in a case of a wafer level package as described above, in which an electronic component is simply encapsulated using a general encapsulating material, it was difficult to suitably control excessive heat generation in accordance with high-functionality of the package, or the like, and an electromagnetic wave.

An aspect of the present disclosure may provide an electronic component package which effectively decreases heat generated in an electronic component and an electromagnetic wave, and a method of manufacturing the same to efficiently manufacture the electronic component package.

According to an aspect of the present disclosure, an electronic component package may include a frame having a metal layer introduced into an encapsulation region of an electronic component in the package.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
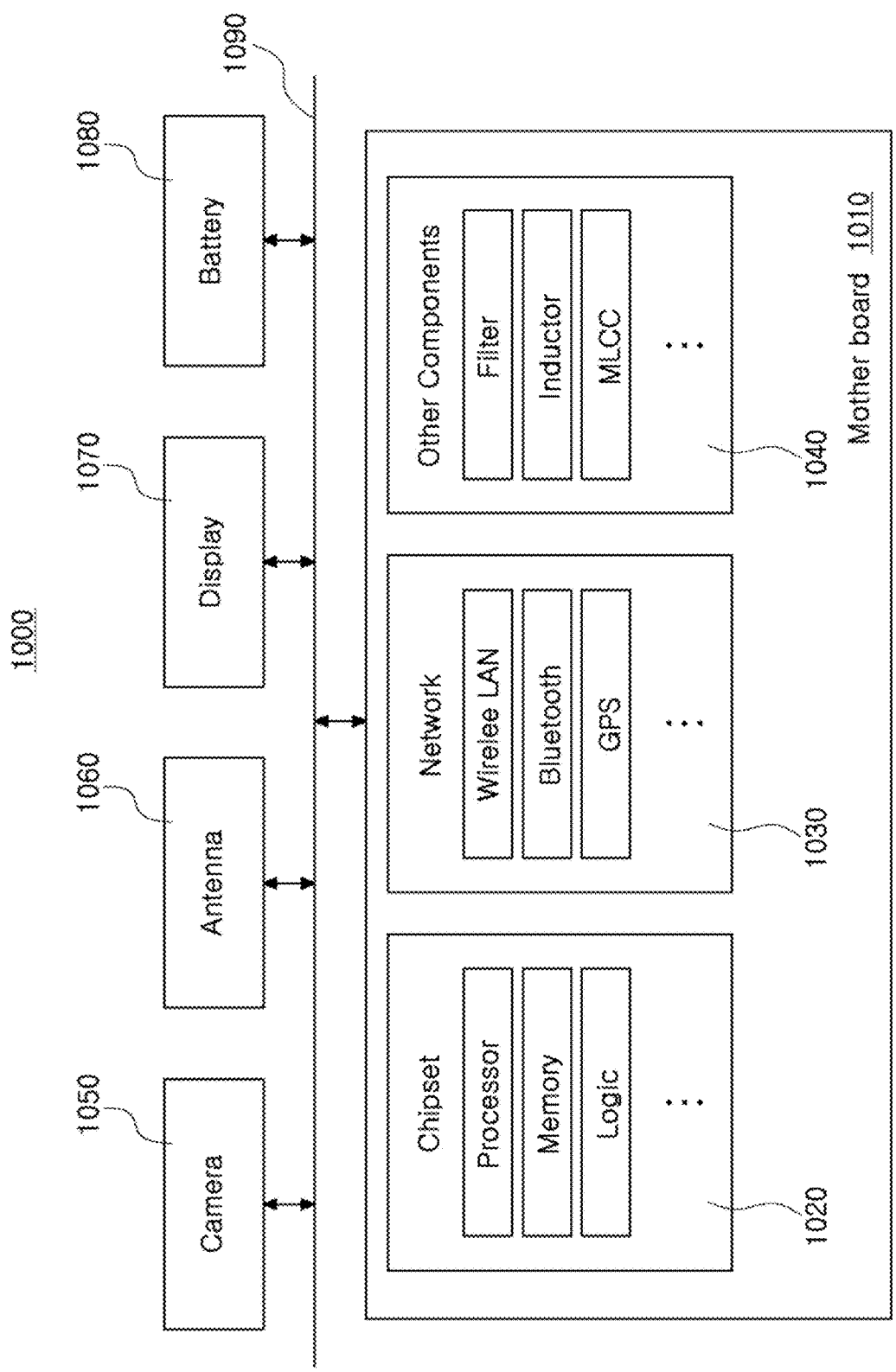
FIG. 1 is a block diagram schematically illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Electronic Device

FIG. 1 is a block diagram schematically illustrating an example of an electronic device system.

Referring to FIG. 1, an electronic device 1000 may accommodate a main board 1010 therein. Chip-related components 1020, network-related components 1030, other components 1040, and the like, may be physically and/or electrically connected to the main board 1010. These components may be coupled to other components to be described below, thereby forming various signal lines 1090.

The chip related components 1020 may include a memory chip such as a volatile memory (for example, a dynamic random access memory (DRAM)), a non-volatile memory (for example, a read only memory (ROM)), a flash memory, etc.; an application processor chip such as a central processor (for example, a central processing unit (CPU)), a graphics processor (for example, a graphic processing unit (GPU)), a digital signal processor, a cryptographic processor, a micro processor, a micro controller, etc.; a logic chip such as an analog-to-digital converter, an application-specific integrated circuit (ASIC), and the like. However, the chip related components 1020 are not limited thereto, and may also include other types of chip related components. Further, these components 1020 may be combined with each other.

The network-related component 1030 may include protocols such as Wi-Fi (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, 5G protocols, and any other wireless and wired protocols designated after the above-mentioned protocols. However, the network-related components 1030 are not limited thereto, and may also include any of a plurality of other wireless or wired standards or protocols. Further, these components 1030 may be combined with each other together with the above-mentioned chip-related components 1020.

Other components 1040 may include a high-frequency inductor, a ferrite inductor, a power inductor, ferrite beads, low-temperature co-firing ceramics (LTCC), an electromagnetic interference (EMI) filter, a multilayer ceramic condenser (MLCC), or the like, but are not limited thereto. In addition to the above-mentioned components, other passive elements, and the like, used for various purposes may be included. Further, other components 1040 may be combined with each other together with the above-mentioned chip-related components 1020 and/or the above-mentioned network-related components 1030.

The electronic device 1000 may include other components which may or may not be physically and/or electrically connected to the main board 1010 depending on the kind of electronic device 1000. An example of these other components may include a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage device (for example, a hard disk drive) (not illustrated), a compact disk (CD) (not illustrated), a digital versatile disk (DVD) (not illustrated), and the like. However, these other components are not limited thereto, and may also include other components, and the like, used for various purposes depending on the kind of electronic device 1000.

The electronic device 1000 may be a smartphone, a personal digital assistant, a digital video camera, a digital still camera, a network system, a computer, a monitor, a tablet, a laptop, a netbook, a television, a video game console, a smart watch, or the like. However, the electronic device 1000 is not limited thereto, and may also be any other electronic device processing data as well as the above-mentioned electronic devices.

Figure 2:
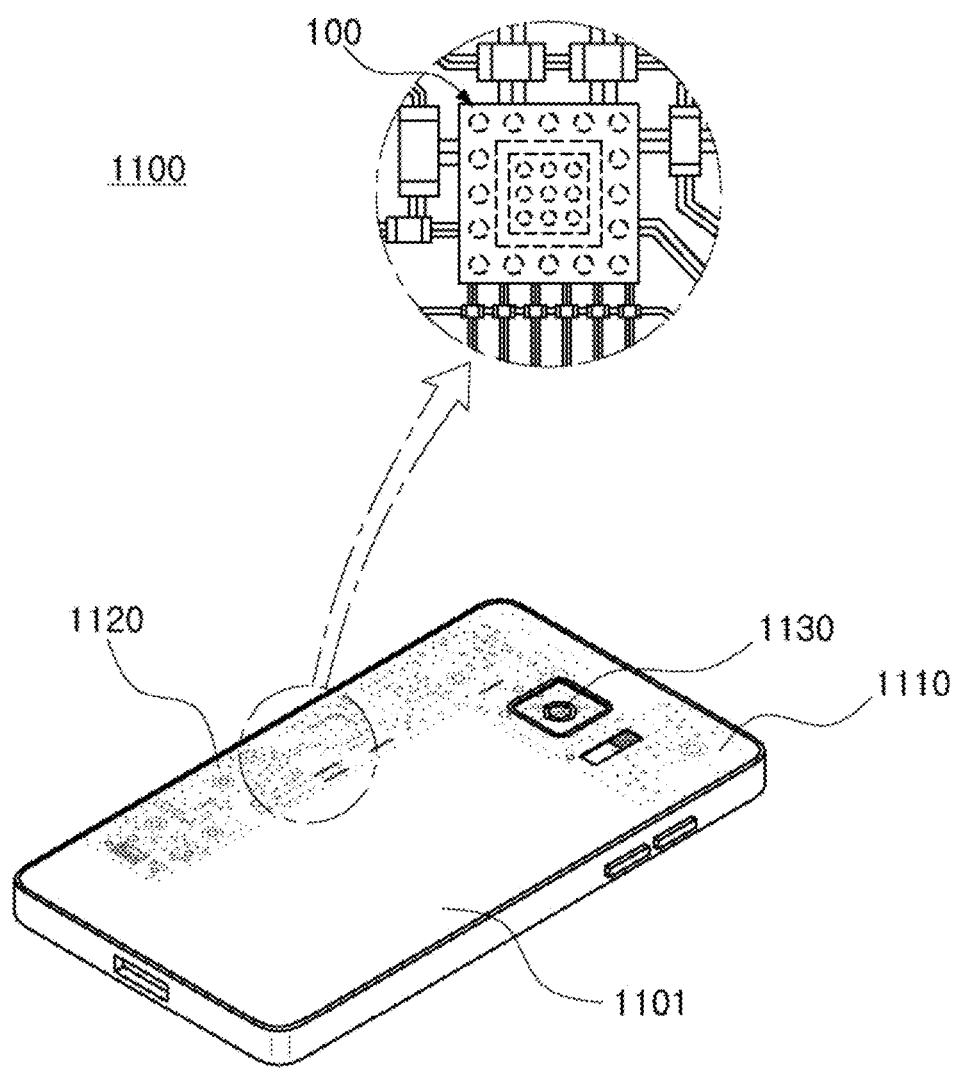
FIG. 2 schematically illustrates an example of an electronic component package applied to an electronic device.

FIG. 2 schematically illustrates an example of an electronic component package applied to an electronic device.

The electronic component package may be used for various purposes in various electronic devices 1000 as described above. For example, a main board 1110 may be accommodated in a body 1101 of a smartphone 1100, and various electronic components 1120 may be physically and/or electrically connected to the main board 1110. Further, another component, for example, a camera 1130, which may or may not be physically and/or electrically connected to the main board 1110, may be accommodated in the body 1101. In this case, some of the electronic components 1120 may be the chip-related components as described above, and the electronic component package 100 may be, for example, an application processor among the chip-related components, but the electronic component 1120 and the electronic component package 100 are not limited thereto.

Electronic Component Package

Figure 3:
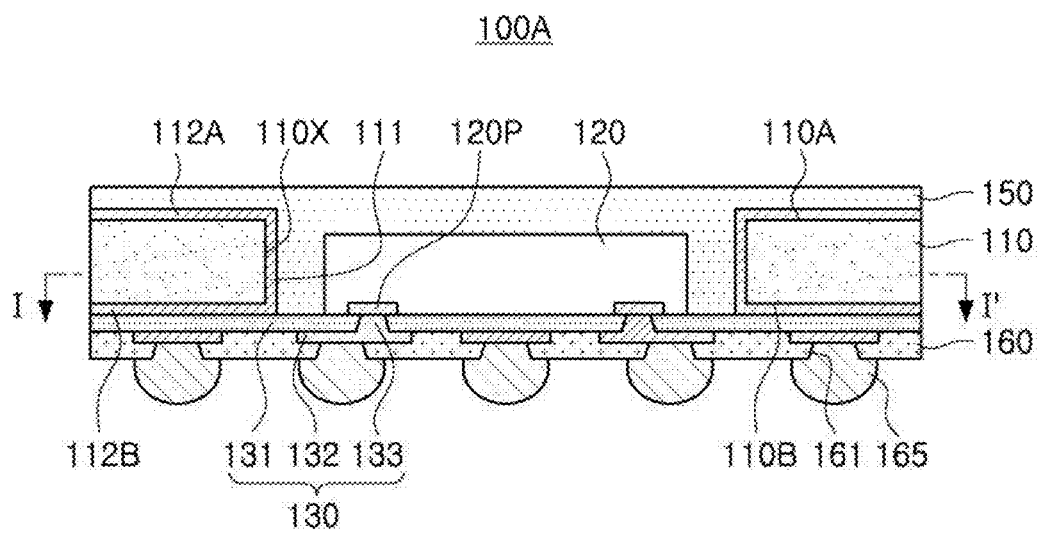
FIG. 3 is a cross-sectional diagram schematically illustrating an example of an electronic component package.

FIG. 3 is a cross-sectional diagram schematically illustrating an example of an electronic component package.

Figure 4:
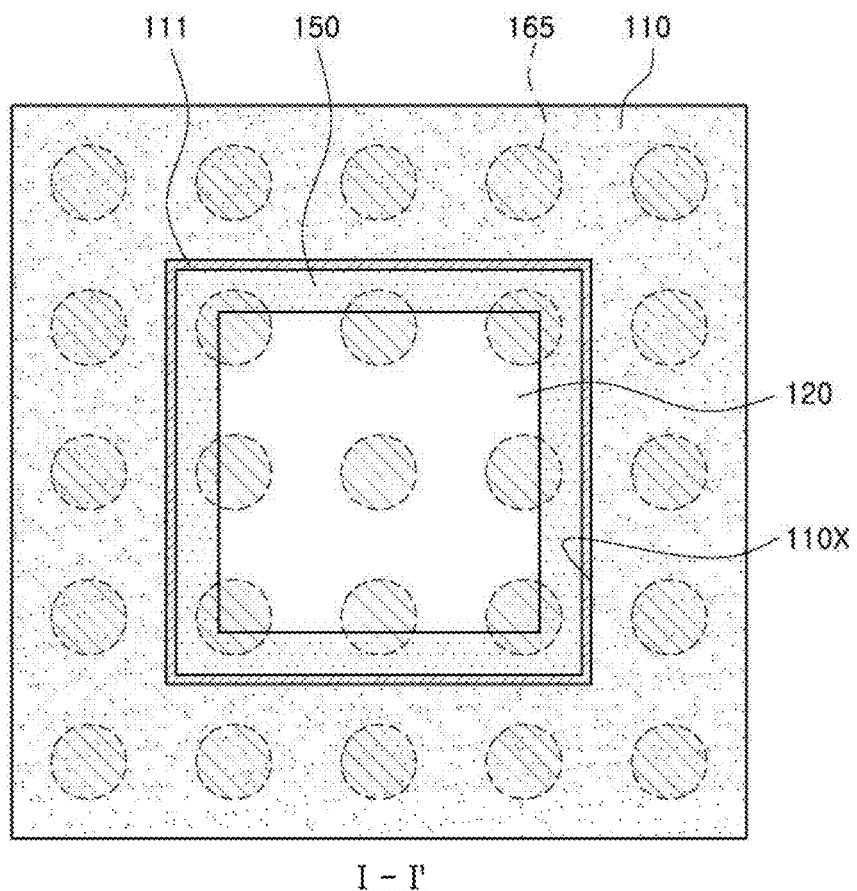
FIG. 4 is a schematic cut-away plan diagram of the electronic component package taken along line I-I' of FIG. 3.

FIG. 4 is a schematic cut-away plan diagram of the electronic component package taken along line I-I' of FIG. 3.

Referring to FIGS. 3 and 4, the electronic component package 100A according to the example may include a frame 110 having a cavity 110X; an electronic component 120 disposed in the cavity 110X of the frame 110; a first metal layer 111 disposed on an inner wall of the cavity 110X of the frame 110; a second metal layer 112B disposed on a lower surface 110B of the frame 110; a third metal layer 112A disposed on an upper surface 110A of the frame 110; an encapsulant 150 encapsulating the electronic component 120; and a redistribution layer 130 disposed below the frame 110 and the electronic component 120. Here, the term "disposed below" may include a case in which a target component is disposed in the corresponding direction but does not contact a component to be a basis as well as a case in which the target component directly contacts the component to be the basis.

In general, an electronic component package has a structure in which the surrounding of an electronic component is simply molded and enclosed with an encapsulant such as an epoxy molding compound (EMC), or the like. In this case, heat generated in the electronic component is mostly radiated downwardly along the redistribution layer, and only a significantly small amount of heat is transferred toward the encapsulant having low heat conductivity, and thus heat radiation characteristics may be deteriorated. Conversely, in a case of introducing the frame 110 having the metal layers 111, 112A, and 112B in an encapsulation region of the electronic component 120, warpage of the package may be effectively controlled by the frame 110, and heat may be easily diffused through various routes by the metal layers 111, 112A, and 112B, and thus heat radiation characteristics may be improved.

Further, in a case of adopting a structure in which the surrounding of the electronic component is simply molded and enclosed with the encapsulant such as the epoxy molding compound (EMC), or the like, operation characteristics, and the like, of an electronic device in which the electronic component is mounted may be deteriorated by electromagnetic interference (EMI) caused by an electromagnetic wave generated in the electronic component or introduced externally. On the contrary, in a case of introducing the frame 110 having the metal layers 111, 112A, and 112B in the encapsulation region of the electronic component 120, generally, since the metal layers 111, 112A, and 112B may also shield the electromagnetic wave, problems caused by the electromagnetic interference may also be solved.

Hereinafter, each of the configurations of the electronic component package 100A according to the example will be described in more detail.

The frame 110 may be a configuration for supporting the package 100A, and due to the frame 110, rigidity may be maintained and thickness uniformity may be secured. The frame 110 may have the upper surface 110A and the lower surface 110B opposing the upper surface 110A, and the cavity 110X may be formed to penetrate between the upper and lower surfaces 110A and 110B. The electronic component 120 may be disposed in the cavity 110X to be spaced apart from the frame 110, and as a result, the frame 110 may enclose around side surfaces of the electronic component 120.

A material of the frame 110 is not particularly limited as long as it may support the package. For example, an insulating material may be used. Here, as the insulating material, a thermosetting resin such as an epoxy resin, a thermoplastic resin such as polyimide, or a resin in which a reinforcement material, such as a glass fiber or an inorganic filler, is impregnated in the thermosetting resin and the thermoplastic resin, for example, a pre-preg, Ajinomoto build-up film (ABF), FR-4, a bismaleimide triazine (BT) resin, or the like, may be used. Alternatively, a metal having excellent rigidity and heat conductivity may be used. In this case, as the metal, an Fe—Ni based alloy may be used. Here, in order to secure adhesive force with a molding material, an interlayer insulating material, or the like, such as a Cu plating layer may be formed on a surface of the Fe—Ni based alloy. In addition, glass, ceramic, plastic, or the like, may be used.

A cross-sectional thickness of the frame 110 is not particularly limited, and may be designed depending on a cross-sectional thickness of the electronic component 120. For example, the cross-sectional thickness of the frame 110 may be, for example, 100 μm to 500 μm or so depending on the kind of electronic component 120.

The electronic components 120 may be various active components (for example, a diode, a vacuum tube, a transistor, or the like) or passive components (for example, an inductor, a condenser, a resistor, or the like). Alternatively, the electronic component 120 may be an integrated circuit (IC) chip in which several hundreds to several millions or more of elements are integrated with each other. If necessary, the electronic component 120 may be an electronic component in which the integrated circuit is packaged in a flip chip form. The integrated circuit may be, for example, an application processor chip such as a central processor (for example, a central processing unit (CPU)), a graphics processor (for example, a graphics processing unit (GPU)), a digital signal processor, a cryptographic processor, a micro processor, a micro controller, or the like, but is not limited thereto.

The electronic component 120 may include an electrode pad 120P electrically connected to the redistribution layer 130. The electrode pad 120P may be a configuration for electrically connecting the electronic component 120 externally, and as a material for forming the electrode pad 120P, any conductive material may be used without particular limitation. As the conductive material, copper (Cu), aluminum (Al), silver (Ag), tin (Sn), gold (Au), nickel (Ni), lead (Pb), an alloy thereof, or the like, may be used, but the material for forming the electrode pad 120P is not limited thereto. The electrode pad 120P may be redistributed by the redistribution layer 130. The electrode pad 120P may be embedded or may protrude.

In a case in which the electronic component 120 is the integrated circuit, the electrode component 120 may have a body (not denoted by a reference numeral), a passivation layer (not denoted by a reference numeral), and the electrode pad 120P. The body may be formed, for example, based on an active wafer. In this case, as a base material of the body, silicon (Si), germanium (Ge), gallium arsenide (GaAs), or the like, may be used. The passivation layer may serve to protect the body from external factors and be formed of, for example, an oxide film, a nitride film, or the like. Alternatively, the passivation layer may be formed of a double layer of an oxide film and a nitride film. As the material for forming the electrode pad 120P, a conductive material such as copper (Cu), aluminum (Al), silver (Ag), tin (Sn), gold (Au), nickel (Ni), lead (Pb), an alloy thereof, or the like, may be used. A surface on which the electrode pad 120P is formed may become an active layer.

The cross-sectional thickness of the electronic component 120 is not particularly limited, and may be changed depending on the kind of electronic component 120. For example, in a case in which the electronic component is the integrated circuit, the cross-sectional thickness of the electronic component 120 may be 100 μm to 480 μm or so, but is not limited thereto.

The first metal layer 111 may basically allow heat generated in the electronic component 120 to be diffused and dispersed toward the frame 110, and shield electromagnetic waves. The first metal layer 111 may be disposed on the inner wall of the cavity 110X, thereby enclosing around the side surfaces of the electronic component 120. The first metal layer 111 may be a layer entirely covering the inner wall of the cavity 110X. In this case, problems of heat generation and electromagnetic interference may be more effectively controlled. The first metal layer 111 may contain a conductive material, for example, copper (Cu), aluminum (Al), silver (Ag), tin (Sn), gold (Au), nickel (Ni), lead (Pb), an alloy thereof, or the like.

The second metal layer 112B may diffuse heat transferred through the first metal layer 111, or the like, downwardly from the package 100A. In addition, the second metal layer 112B may further improve an electromagnetic wave shielding effect. The second metal layer 112B may be disposed on the lower surface 110B of the frame 110, and according to the example, the second metal layer 112B may be a layer entirely covering the lower surface 110B, and thus the problems of heat generation and electromagnetic interference may be more effectively controlled. The second metal layer 112B may also contain a conductive material, for example, copper (Cu), aluminum (Al), silver (Ag), tin (Sn), gold (Au), nickel (Ni), lead (Pb), an alloy thereof, or the like.

If necessary, the second metal layer 112B may be connected to a redistribution pattern serving as a ground (GND) pattern among conductive patterns 132 of the redistribution layer 130. Alternatively, the second metal layer 112B may be connected to a dummy pattern among the conductive patterns 132 of the redistribution layer 130. In this case, heat may be more easily dispersed downwardly from the package 100A. However, the second metal layer 112B is not limited thereto, and heat may also be transferred by diffusion in a state in which the second metal layer 112B is not connected to the conductive pattern 132.

The third metal layer 112A may diffuse heat transferred through the first metal layer 111, or the like, upwardly from the package 100A. In addition, the third metal layer 112A may further improve the electromagnetic wave shielding effect. The third metal layer 112A may be disposed on the upper surface 110A of the frame 110, and according to the example, the third metal layer 112A may be a layer entirely covering the upper surface 110A, and thus the problems of heat generation and electromagnetic interference may be more effectively controlled. The third metal layer 112A may also contain a conductive material, for example, copper (Cu), aluminum (Al), silver (Ag), tin (Sn), gold (Au), nickel (Ni), lead (Pb), an alloy thereof, or the like.

The redistribution layer 130 may be a configuration for redistributing the electrode pad 120P of the electronic component 120. Several tens to several hundreds of electrode pads 120P having various functions may be redistributed through the redistribution layer 130, and physically and/or electrically connected externally depending on the functions thereof through an external connection terminal 165 to be described below.

The redistribution layer 130 may include an insulating layer 131, a conductive pattern 132 disposed on the insulating layer 131, and a conductive via 133 penetrating through the insulating layer 131. In the electrode component package 100A according to the example, the redistribution layer 130 may be composed of a single layer. However, the redistribution layer 130 is not limited thereto, and may be composed of a plurality of layers as described below.

As a material of the insulating layer 131, an insulating material may be used. In this case, as the insulating material, a thermosetting resin such as an epoxy resin, a thermoplastic resin such as polyimide, or a resin in which a reinforcement material, such as a glass fiber or an inorganic filler, is impregnated in the thermosetting resin and the thermoplastic resin, for example, a pre-preg, Ajinomoto build-up film (ABF), FR-4, a bismaleimide triazine (BT) resin, or the like, may be used. In a case of using a photosensitive insulating material such as a photo imageable dielectric (PID) resin, the insulating layer 131 may be formed to be thinner, and a fine pitch may be easily implemented. The insulating layers 131 may be formed of the same material as each other, or different materials from each other, if necessary. A thickness of the insulating layer 131 is also not particularly limited. For example, a thickness of the insulating layer 131 except for the conductive pattern 132 may be 5 μm to 20 μm or so, and in the consideration of a thickness of the conductive pattern 132, the insulating layer 131 may have a thickness of 15 μm to 70 μm or so.

The conductive pattern 132 may serve as a redistribution pattern, and as a material for forming the conductive pattern 132, a conductive material such as copper (Cu), aluminum (Al), silver (Ag), tin (Sn), gold (Au), nickel (Ni), lead (Pb), an alloy thereof, or the like, may be used. The conductive patterns 132 and 142 may perform various functions depending on a design of the corresponding layer. For example, the conductive pattern 132 may perform a role of a ground (GND) pattern, a power (PWR) pattern, a signal (S) pattern, or the like. Here, the signal (S) pattern may include various signal patterns, for example, a data signal pattern, or the like, except for the GND pattern, the PWR pattern, and the like. Further, the conductive pattern 132 may perform a role of a via pad, an external connection terminal pad, or the like. A thickness of the conductive pattern 132 is also not particularly limited. For example, each of the conductive patterns 132 may have a thickness of 10 μm to 50 μm or so.

If necessary, a surface treatment layer may be further formed on an exposed conductive pattern 132 among the conductive patterns 132. The surface treatment layer is not particularly limited as long as it is known in the art. For example, the surface treatment layer may be formed by electrolytic gold plating, electroless gold plating, organic solderability preservative (OSP) surface treatment or electroless tinplating, electroless silver plating, electroless nickel plating/displacement gold plating, direct immersion gold (DIG) plating, hot air solder leveling (HASL), or the like.

The conductive via 133 may electrically connect the conductive pattern 132, the electrode pad 120, and the like, to each other, which are formed on different layers from each other, thereby forming an electric path in the package 100A. A conductive material such as copper (Cu), aluminum (Al), silver (Ag), tin (Sn), gold (Au), nickel (Ni), lead (Pb), an alloy thereof, or the like, may be used as a material for forming the conductive via 133. The conductive via 133 may also be completely filled with the conductive material, or the conductive material may be formed on a wall of the via. Further, all shapes known in the art, such as a tapered shape of which a diameter is decreased downwardly, a reversely tapered shape of which a diameter is increased downwardly, a cylindrical shape, and the like, may be applied to the conductive via 133.

The encapsulant 150 may be a configuration for protecting the electronic component 120. To this end, the encapsulant 150 may encapsulate the electronic component 120. A shape of the encapsulant 150 is not particularly limited as long as the encapsulant 150 at least partially encloses the electronic component 120. According to the example, the encapsulant 150 may cover upper portions of the frame 110 and the electronic component 120. As a result, the encapsulant may fill the remaining space in the cavity 110X of the frame 110. Here, the term "covers upper portions" may include a case in which a target component is disposed in the corresponding direction but does not contact a component to be a basis as well as a case in which the target component directly contacts the component to be the basis. Meanwhile, the encapsulant 150 fills the cavity 110X, and thus the encapsulant 150 may serve to decrease buckling of the electronic component 120 while serving as an adhesive depending on a specific material of the encapsulant 150.

The encapsulant 150 may be composed of a plurality of layers formed of a plurality of materials. For example, a space in the cavity 110X may be filled with a first encapsulant, and then, the upper portions of the frame 110 and the electronic component 120 may be covered with a second encapsulant. Alternatively, after covering the upper portions of the frame 110 and the electronic component 120 at a predetermined thickness while filling the space in the cavity 110X using the first encapsulant, the second encapsulant may be used to cover the first encapsulant again at a predetermined thickness. Besides, the encapsulant 150 may be applied in various forms.

A specific material of the encapsulant 150 is not particularly limited. For example, as the material of the encapsulant 150, an insulating material may be used. Here, as the insulating material, similarly, a thermosetting resin such as an epoxy resin, a thermoplastic resin such as polyimide, or a resin in which a reinforcement material, such as a glass fiber or an inorganic filler, is impregnated in the thermosetting resin and the thermoplastic resin, for example, a prepreg, ABF, FR-4, a BT resin, a photo imageable dielectric (PID) resin, or the like, may be used. Further, a molding material known in the art such as an epoxy molding compound (EMC), or the like, may also be used.

The encapsulant 150 may have an elastic modulus lower than that of a material of the frame 110. For example, the encapsulant 150 may have an elastic modulus of 15 GPa or less, for example, 50 MPa to 15 GPa or so. As the elastic modulus of the encapsulant 150 is relatively decreased, warpage of the package 100A may be further decreased through a buckling effect and a stress dispersion effect on the electronic component 120. In detail, since the encapsulant 150 fills the space of the cavity 110X, the encapsulant 150 may have the buckling effect on the electronic component 120, and since the encapsulant 150 covers the electronic component 120, the encapsulant 150 may disperse and alleviate stress generated in the electronic component 120. However, in a case in which the elastic modulus is excessively small, the encapsulant 150 may not perform basic roles thereof due to excessive deformation.

If necessary, a conductive particle may be contained in the encapsulant 150 for shielding the electromagnetic wave. As the conductive particle, any conductive particle may be used as long as it may shield the electromagnetic wave. For example, the conductive particle may be formed of copper (Cu), aluminum (Al), silver (Ag), tin (Sn), gold (Au), nickel (Ni), lead (Pb), solder, or the like. However, these materials are only examples, and the conductive particle is not particularly limited thereto.

An interval of the space in the cavity 110X filled with the encapsulant 150 is not particularly limited, and may be optimized by a person with ordinary skill in the art. For example, the interval may be 10 μm to 150 μm or so, but is not limited thereto.

The electronic component package 100A according to the example may further include an external layer 160 disposed below the redistribution layer 130. The external layer 160 may be a configuration for protecting the redistribution layer 130 from external physical or chemical damages, or the like. The external layer 160 may have an opening 161 exposing at least a portion of the conductive pattern 132 of the redistribution layer 130. The opening 161 may expose one surface of a portion of the conductive patterns 132, but in some cases, the opening 161 may expose a side surface thereof.

A material of the external layer 160 is not particularly limited. For example, a solder resist may be used. Besides, the same material as that of the insulating layer 131 of the redistribution layer 130, for example, the same PID resin may also be used. The external layer 160 may be generally a single layer, but may be configured as a plurality of layers, as needed.

The electronic component package 100A according to the example may further include an external connection terminal 165 externally exposed through a lower surface of the external layer 160. The external connection terminal 165 may be a configuration for physically and/or electrically connecting the electronic component package 100A externally. For example, the electronic component package 100A may be mounted on a main board of an electronic device through the external connection terminal 165. The external connection terminal 165 may be disposed in the opening 161 and connected to the conductive pattern 132 exposed to the opening 161. Therefore, the external connection terminal 165 may also be electrically connected to the electronic component 120.

The external connection terminal 165 may be formed of a conductive material, for example, copper (Cu), aluminum (Al), silver (Ag), tin (Sn), gold (Au), nickel (Ni), lead (Pb), solder, or the like. However, these materials are only examples, and the material of the external connection terminal 165 is not particularly limited thereto. The external connection terminal 165 may be a land, a ball, a pin, or the like. The external connection terminal 165 may be formed of a multilayer or a single layer. In a case in which the external connection terminal 165 is formed of the multilayer, the external connection terminal 165 may contain a copper pillar and solder, and in a case in which the external connection terminal 165 is formed of the single layer, the external connection terminal 165 may contain tin-silver solder or copper. However, these cases are only examples, and the external connection terminal 165 is not limited thereto.

Some of the external connection terminals 165 may be disposed in a fan-out region. The fan-out region may be defined as a region deviated from a region in which the electronic component 120 is disposed. That is, the electronic component package 100A according to the example may be a fan-out package. In the case of the fan-out package, reliability may be more excellent as compared to a fan-in package, a plurality of I/O terminals may be implemented, and 3D interconnection may be easily performed. Further, since the fan-out package may be mounted on an electronic device without a separate board as compared to a ball grid array (BGA) package, a land grid array (LGA) package, or the like, the fan-out package may be manufactured to have a reduced thickness, and price competitiveness may be excellent.

The number, an interval, a disposition shape, or the like, of external connection terminal 165 are not particularly limited, and may be sufficiently changed by a person skilled in the art depending on a design. For example, the number of external connection terminals 165 may be several tens to several thousands depending on the number of electrode pads 120P of the electronic component 120, but is not limited thereto. The number of external connection terminals 165 may be more than or less than the above-mentioned range.

FIGS. 5A through 5E illustrate an example of a schematic manufacturing process of the electronic component package of FIG. 3.

Among descriptions of the example of the manufacturing process of the electronic component package 100A, a description overlapping the description of the electronic component package 100A described above will be omitted, and a difference therebetween will be mainly described below.

Figure 5A:
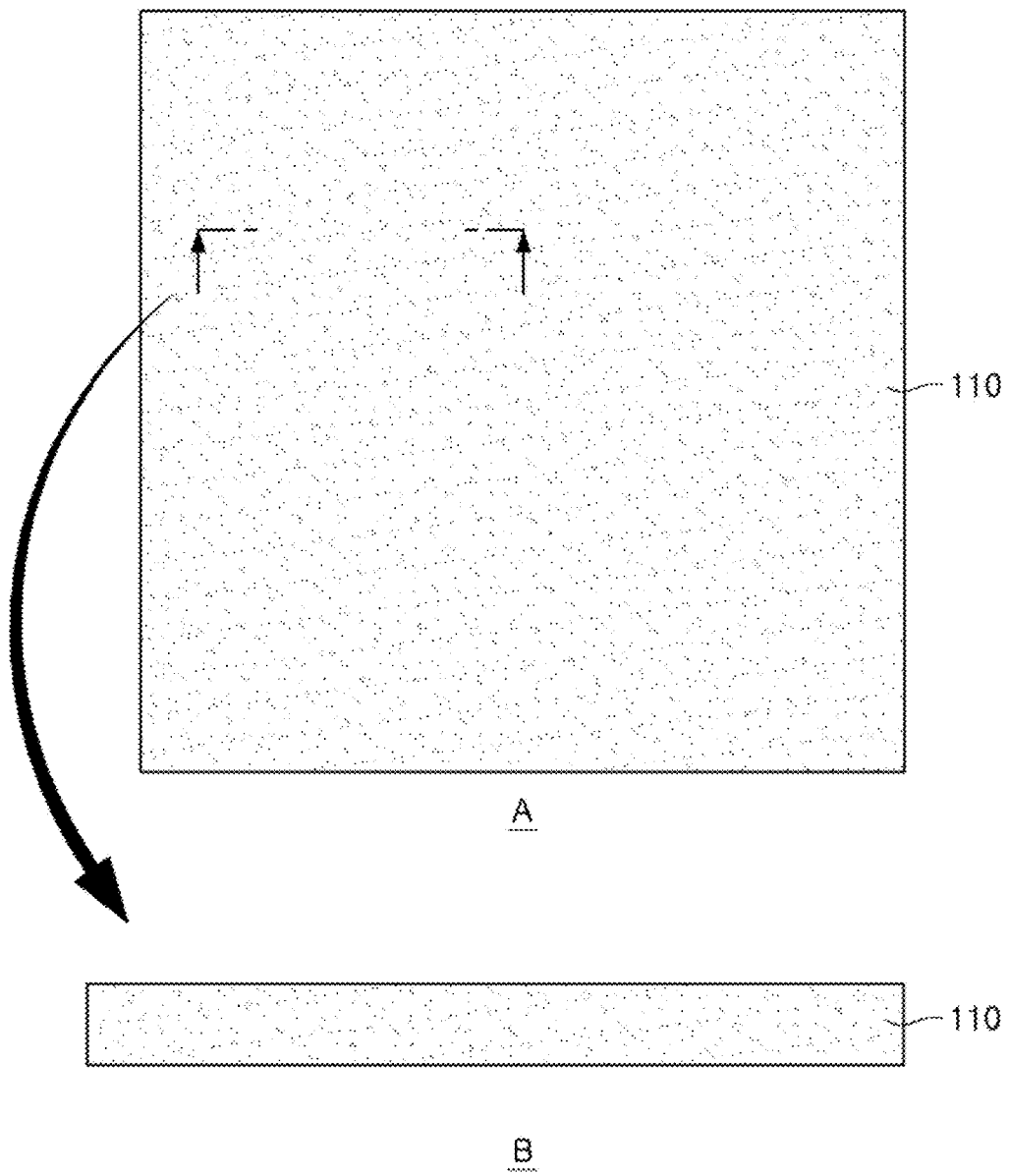
FIGS. 5A through 5E illustrate an example of a schematic manufacturing process of the electronic component package of FIG. 3.

Referring to FIG. 5A, a frame 110 may be prepared. Here, A indicates a plan diagram of the frame 110, and B illustrates a cross section of some region capable of being utilized as a unit package in A. The frame 110 may be manufactured to have various sizes to thereby be utilized so that mass production may be easily performed. That is, after preparing a large size frame 110, a plurality of electronic component packages 100A may be manufactured through a process to be described below. Then, the plurality of electronic component packages 100 may be singulated into individual packages 100 by sawing. A fiducial mark for excellent pick-and-place (P&P) may be provided on the frame 110, and thus a position at which an electronic component 120 is mounted may be more accurately confirmed through the fiducial mark, thereby improving manufacturing completeness.

Figure 5B:
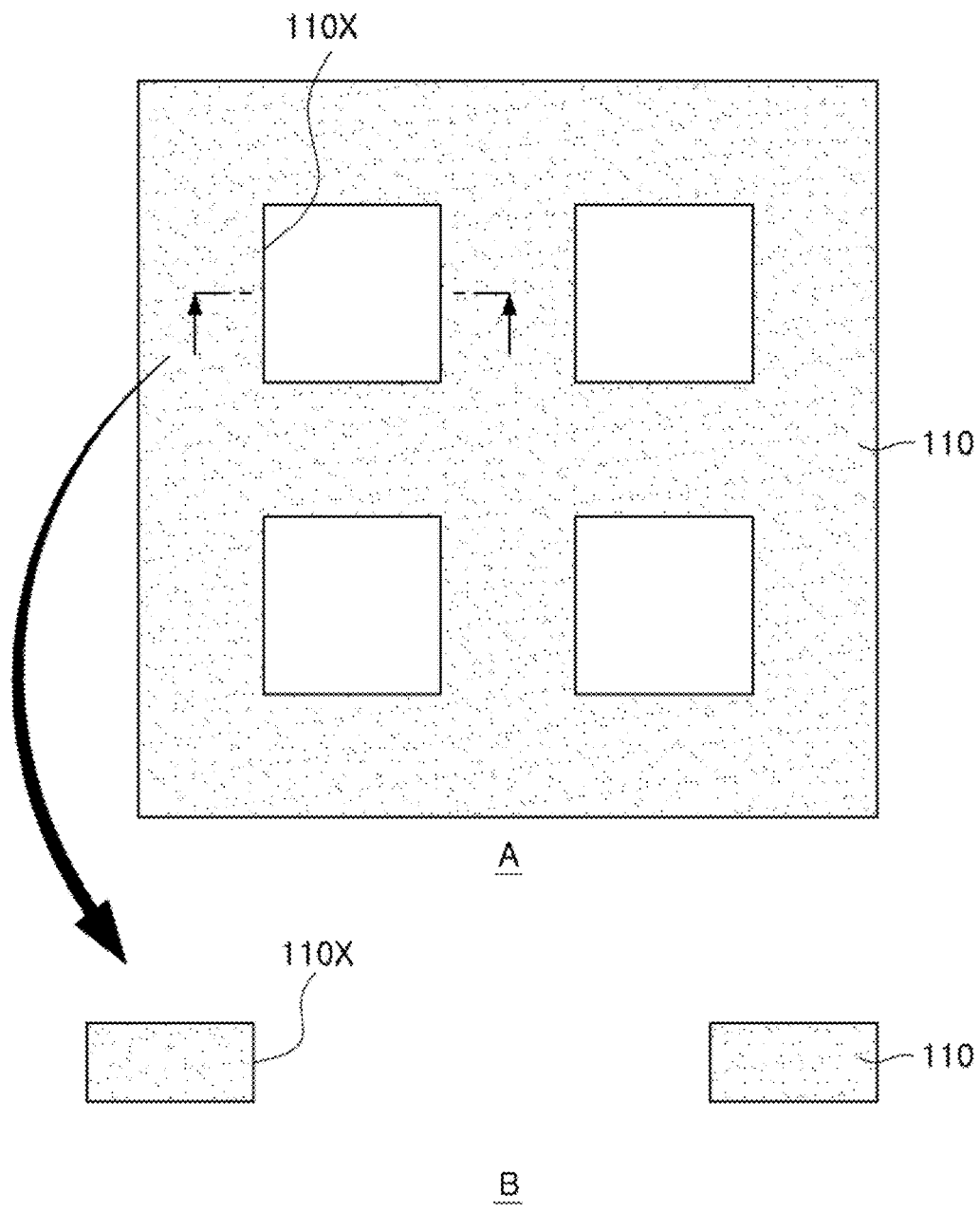

Referring to FIG. 5B, a cavity 110X penetrating through the frame 110 may be formed. Here, A indicates a plan diagram of the frame 110 in which the cavities 110X are formed, and B illustrates a cross section of some region capable of being utilized as a unit package in A. A method of forming the cavity 110X is not particularly limited. For example, the cavity 110X may be formed by a mechanical and/or laser drill method, a sand-blasting method using polishing particles, a dry etching method using plasma, or the like. In a case in which the cavity 110X is formed using a mechanical drill and/or the laser drill, desmear treatment such as a permanganate method, or the like, may be performed to remove resin smear in the cavity 110X. A size, a shape, or the like, of the cavity 110X may be designed to be suitable for a size, a shape, the number, or the like, of an electronic component 120 to be mounted.

Figure 5C:
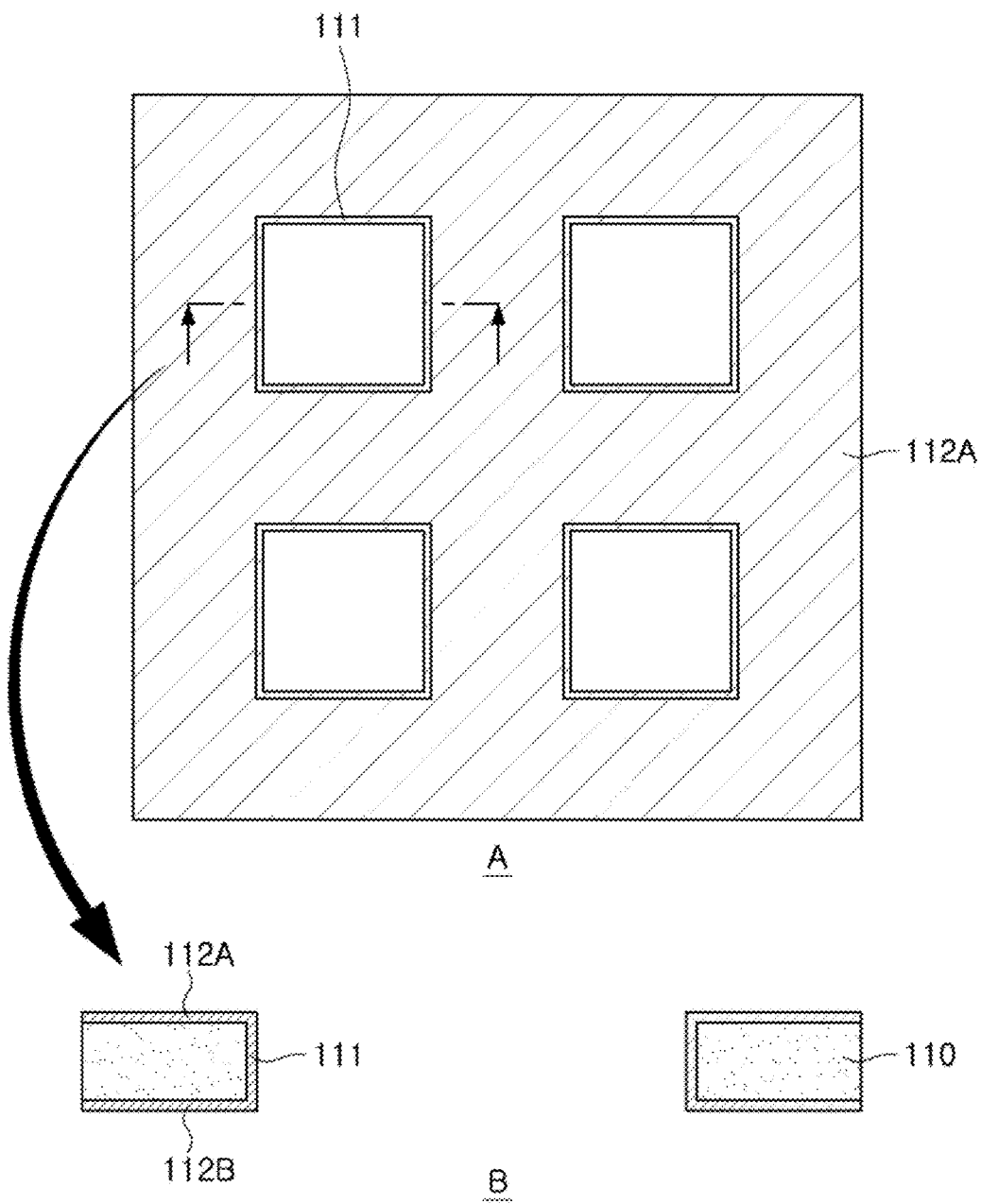

Referring to FIG. 5C, metal layers 111, 112A, and 112B may be formed on upper and lower surfaces 110A and 110B of the frame 110 and an inner wall of the cavity 110X. Here, A indicates a plan diagram of the frame 110 in which the metal layers 111, 112A, and 112B are formed, and B illustrates a cross section of some region capable of being utilized as a unit package in A. The metal layers 111, 112A, and 112B may be formed by a method known in the art. For example, the metal layers 111, 112A, and 112B may be formed by electrolytic copper plating, electroless copper plating, or the like. In more detail, the metal layers 111, 112A, and 112B may be formed by a method such as a chemical vapor deposition (CVD) method, a physical vapor deposition (PVD) method, a sputtering method, a subtractive method, an additive method, a semi-additive process (SAP), a modified semi-additive process (MSAP), or the like, but is not limited thereto.

Figure 5D:
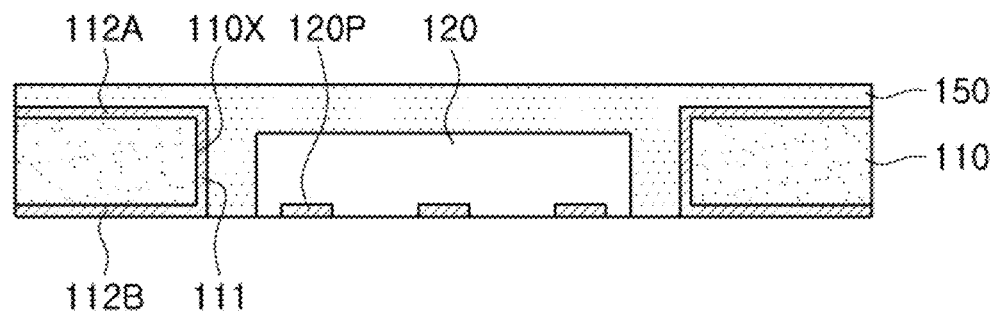

Referring to FIG. 5D, the electronic component 120 may be disposed in the cavity 110X. The electronic component 120 may be disposed in a face-down manner so that the electrode pad 120P faces downwardly. However, the electronic component 120 is not limited thereto, and if necessary, the electronic component 120 may also be disposed in a face-up manner. Thereafter, the electronic component 120 may be encapsulated using an encapsulant 150. The encapsulant 150 may fill a space in the cavity 110X while covering upper portions of the frame 110 and the electronic component 120. The encapsulant 150 may be formed by a method known in the art. For example, the encapsulant 150 may be formed by laminating a precursor of the encapsulant 150 and curing the laminated precursor. Alternatively, the encapsulant 150 may be applied in a state in which a lower portion of the cavity 110 is closed using a tape (not illustrated), or the like, so as to encapsulate the electronic component 120, and then the applied encapsulant 150 may be cured. The electronic component 120 may be fixed by curing. As the method of laminating the precursor, for example, a method of performing a hot press method of pressing an object at a high temperature for a predetermined time, cooling the object to room temperature by decompression, and then separating a working tool in a cold press by cooling, or the like, may be used. As an application method, for example, a screen printing method of applying ink using a squeegee, a spray printing method of misting ink to apply the ink, or the like, may be used.

Figure 5E:
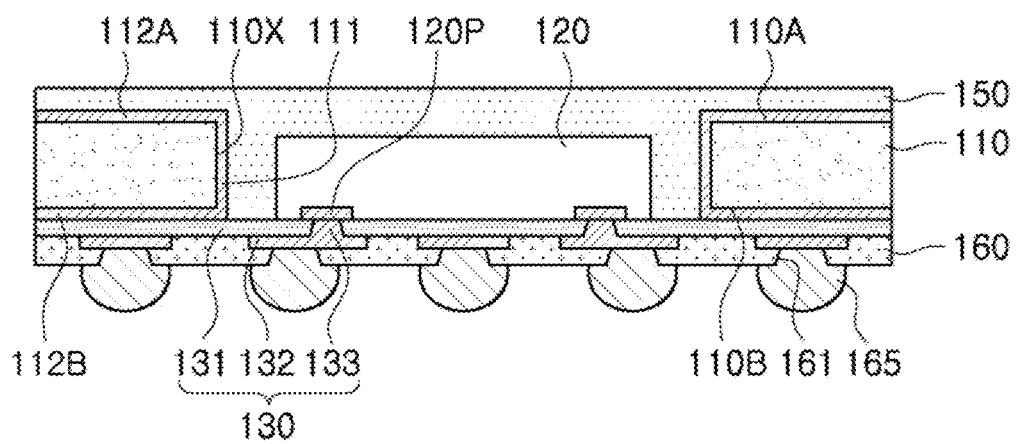

Referring to FIG. 5E, a redistribution layer 130 may be formed below the frame 110 and the electronic component 120. In detail, an insulating layer 131 may be formed below the frame 110 and the electronic component 120, and then, a conductive pattern 132 and a conductive via 133 may be formed, and thus the redistribution layer 130 may be formed.

The insulating layer 131 may be formed by a method known in the art. For example, the insulating layer 131 may be formed by a method of laminating a precursor of the insulating layer 131 and curing the laminated precursor, a method of applying a material of the insulating layer 131 and curing the applied material, or the like, but is not limited thereto. As the method of laminating the precursor, for example, a method of performing a hot press method of pressing an object at a high temperature for a predetermined time, cooling the object to room temperature by decompression, and then separating a working tool in a cold press by cooling, or the like, may be used. As an application method, for example, a screen printing method of applying ink using a squeegee, a spray printing method of misting ink to apply the ink, or the like, may be used. The curing process, which is a post-process, may be a process of drying the encapsulation material so as not be completely cured in order to use a photolithography process, or the like.

The conductive pattern 132 and the conductive via 133 may also be formed by a method known in the art. First, a via hole (not illustrated) may be formed using the mechanical drill and/or laser drill as described above, and in a case in which the insulating layer 131 contains a PID resin, or the like, the via hole may also be formed using a photolithography method. The conductive pattern 132 and the conductive via 133 may be formed using a dry film pattern by electrolytic copper plating, electroless copper plating, or the like.

After the redistribution layer 130 is formed, an external layer 160 may be formed below the redistribution layer 130. Similarly, the external layer 160 may be formed by a method of laminating a precursor of the external layer 160 and curing the laminated precursor, a method of applying a material for forming the external layer 160 and curing the applied material, or the like. Thereafter, an opening 161 may be formed in the external layer 160 so that the conductive pattern 132 is at least partially exposed. The opening 161 may be formed using a mechanical drill and/or laser drill. Alternatively, the opening 161 may be formed by a photolithography method.

After the opening 161 is formed in the external layer 160, an external connection terminal 165 disposed in the opening 161 may be formed. A method of forming the external connection terminal 165 is not particularly limited, and the external connection terminal 165 may be formed by a method well-known in the art depending on a structure or shape thereof. The external connection terminal 165 may be fixed by reflow, and in order to increase fixation power, a portion of the external connection terminal 165 may be embedded in the external layer 160, and the other portion thereof may be externally exposed, thereby improving reliability. In some cases, only the opening 161 may be formed, and the external connection terminal 165 may be formed by a separate process in a purchase customer of the package 100A as needed.

Figure 6:
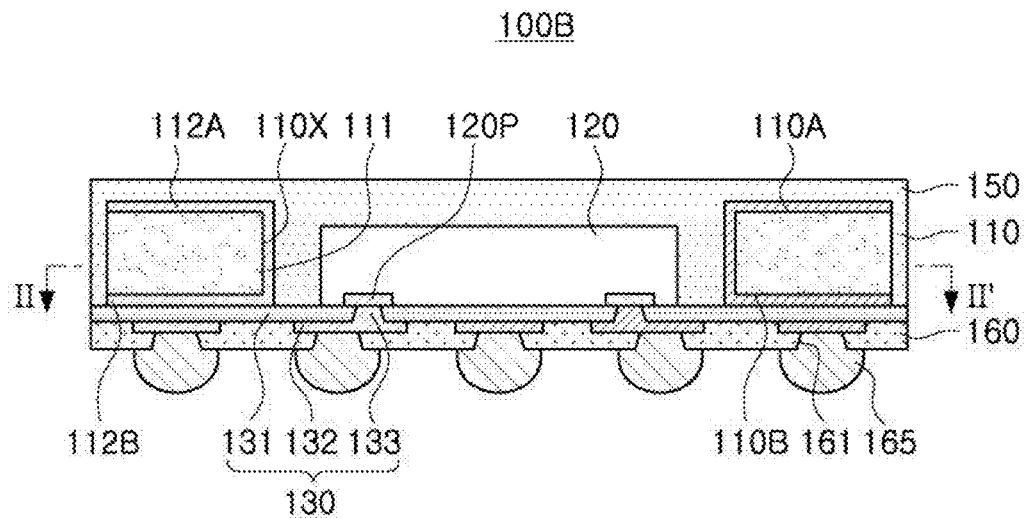
FIG. 6 is a cross-sectional diagram schematically illustrating another example of the electronic component package.

FIG. 6 is a cross-sectional diagram schematically illustrating another example of the electronic component package.

Figure 7:
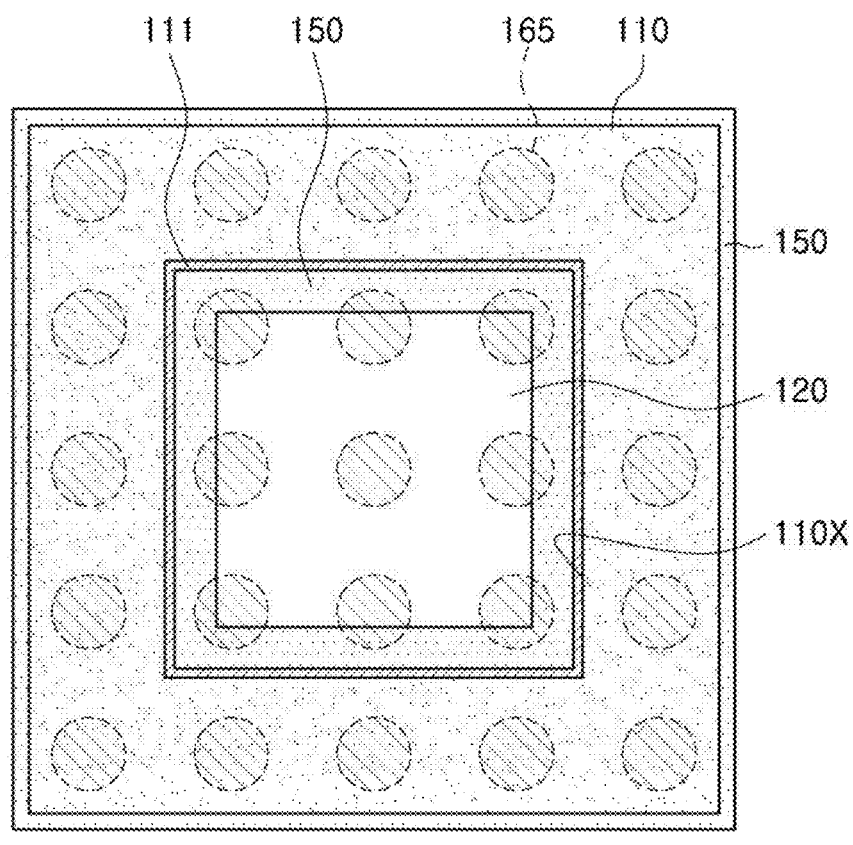
FIG. 7 is a schematic cut-away plan diagram of the electronic component package taken along line II-II' of FIG. 6.

FIG. 7 is a schematic cut-away plan diagram of the electronic component package taken along line II-II' of FIG. 6.

Referring to FIGS. 6 and 7, in an electronic component package 100B according to another example, an encapsulant 150 may also enclose outer side surfaces of a frame 110. When the frame 110 is enclosed by the encapsulant 150 as described above, the frame 110 is not externally exposed, and thus reliability may be improved by prevention of oxidation, or the like. Since a description of each of the configurations included in the electronic component package 100B according to another example overlaps the description described above, a description thereof will be omitted. Further, since a method of manufacturing the electronic component package 100B according to another example is the same as the method of manufacturing the electronic component package 100A described above except for forming the frame 110 so that the encapsulant 150 encloses the outer side surfaces of the frame 110, etc., a description thereof will be omitted.

Figure 8:
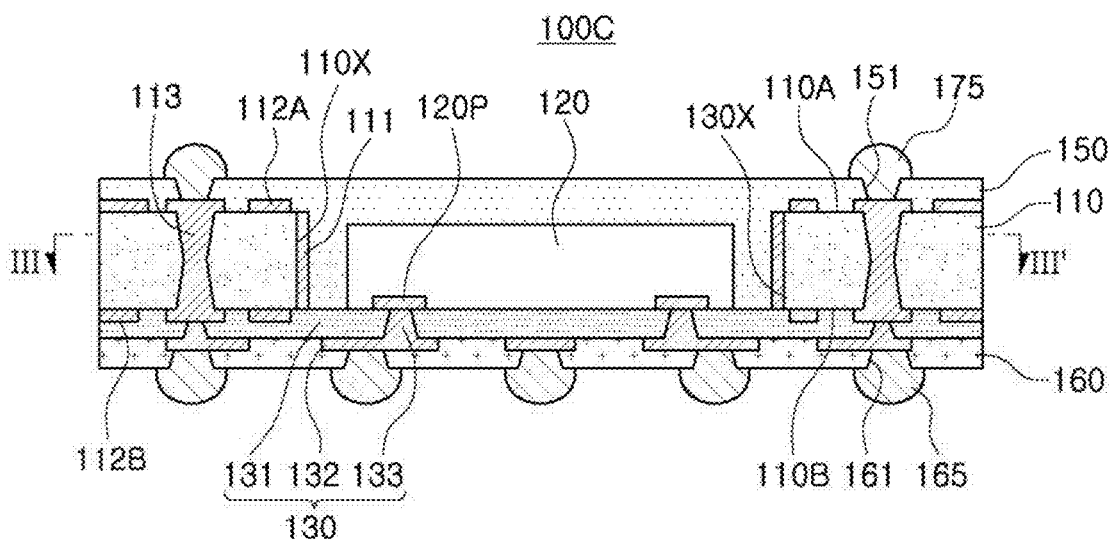
FIG. 8 is a cross-sectional diagram schematically illustrating another example of the electronic component package.

FIG. 8 is a cross-sectional diagram schematically illustrating another example of the electronic component package.

Figure 9:
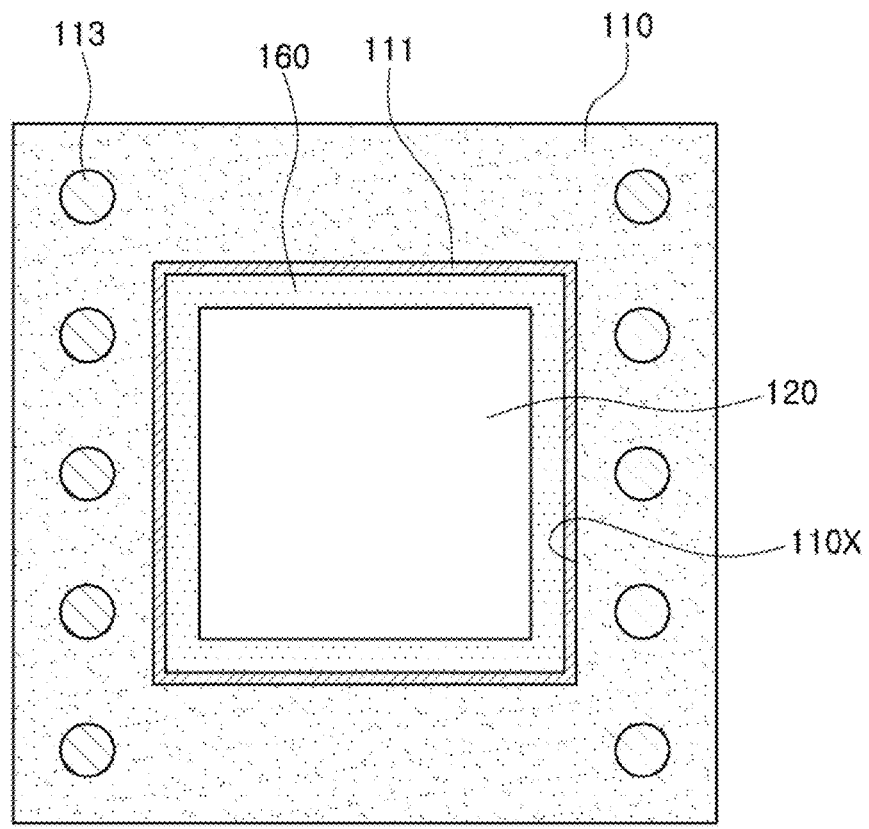
FIG. 9 is a schematic cut-away plan diagram of the electronic component package taken along line III-III' of FIG. 8.

FIG. 9 is a schematic cut-away plan diagram of the electronic component package taken along line III-III' of FIG. 8.

Referring to FIGS. 8 and 9, an electronic component package 100C according to another example may further include a penetration wiring 113 penetrating through a frame 110, and second and third metal layers 112B and 112A disposed on lower and upper surfaces 110B and 110A of the frame 110 may be patterned. Hereinafter, each of the configurations included in the electronic component package 100C according to another example will be described in more detail, but a description overlapping the description described above will be omitted, and a difference therebetween will be mainly described.

The penetration wiring 113 penetrating through the upper and lower surfaces 110A and 110B of the frame 110 may serve to electrically connect conductive patterns disposed on different layers to each other, and a material for forming the penetration wiring 113, a conductive material such as copper (Cu), aluminum (Al), silver (Ag), tin (Sn), gold (Au), nickel (Ni), lead (Pb), an alloy thereof, or the like, may be used. Upper and lower portions of the electronic component package 100C may be electrically connected to each other through left and right side surfaces of the electronic component 120 by the penetration wiring 113, and thus space utilization may be significantly increased. Therefore, the electronic component package 100C may be applied to a package on package (PoP), or the like, through connection in a three-dimensional structure, and thus the electronic component package 100C may be widely applied to various current modules or package application products. The number, an interval, a disposition shape, and the like, of the penetration wiring 113 are not particularly limited, and may be sufficiently changed by a person skilled in the art depending on a design. The penetration wiring 113 may be connected to a pad pattern serving as a pad of the penetration wiring among the second and third metal layers 112B and 112A. For example, the penetration wiring 113 may be disposed only in a specific region of the frame 110 as illustrated in FIG. 9 depending on a shape of another package mounted on the electronic component package 100C. Unlike this, the penetration wiring 113 may be disposed on the entire surface of the frame 110. In a case of using a metal, for example, an Fe—Ni based alloy, or the like, as the material of the frame 110, an insulating material may be disposed between the metal and the penetration wiring 113 and/or the metal layers 112A and 112B for electrical insulation with the penetration wiring 113 or the metal layers 112A and 112B.

The second and third metal layers 112B and 112A may also serve as redistribution patterns, and as a material for forming the second and third metal layers 112B and 112A, a conductive material such as copper (Cu), aluminum (Al), silver (Ag), tin (Sn), gold (Au), nickel (Ni), lead (Pb), an alloy thereof, or the like, may be used. The second and third metal layers 112B and 112A may perform various functions depending on a design of the corresponding layer. For example, the second and third metal layers 112B and 112A may perform roles of a ground (GND) pattern, a power (PWR) pattern, a signal (S) pattern, a bond finger (BF) pattern, and the like. Here, the signal (S) pattern may include various signal patterns, for example, a data signal pattern, or the like, except for the GND pattern, the PWR pattern, the bond finger (BF) pattern, and the like. Further, the second and third metal layers 112B and 112A may perform roles of a via pad, a penetration wiring pad, an external connection terminal pad, and the like. A thickness of the second and third metal layers 112B and 112A is also not particularly limited. For example, each of the second and third metal layers 112B and 112A may have a thickness of 10 µm to 50 µm or so. In some cases, the second and third metal layers 112B and 112A may be dummy patterns without a redistribution function. According to another example, the second and third metal layers 112B and 112A may not be connected to a first metal layer 111. However, in a case in which the second and third metal layers 112B and 112A are ground (GND) patterns or dummy patterns, the second and third metal layers 112B and 112A may be connected to the first metal layer 111, but are not limited thereto.

In the electronic component package 100C according to another example, an encapsulant 150 may have an opening 151 at least partially exposing the third metal layer 112A disposed on the upper surface 110A of the frame 110. Further, the electronic component package 100C may further include an external connection terminal 175 externally exposed through an outer edge surface of the encapsulant 150. The external connection terminal 175 may be a configuration for physically and/or electrically connecting another electronic component, another package, or the like, on the electronic component package 100C to the electronic component package 100C. For example, another electronic component package may be mounted on the electronic component package 100C through the external connection terminal 175, thereby forming a package-on-package structure. The external connection terminal may be disposed in the opening 151 of the encapsulant 150 and connected to the third metal layer 112A exposed through the opening 151. Therefore, the external connection terminal may be electrically connected to the electronic component 120.

The external connection terminal 175 may be formed of a conductive material, for example, copper (Cu), aluminum (Al), silver (Ag), tin (Sn), gold (Au), nickel (Ni), lead (Pb), solder, or the like. However, these materials are only examples, and the material of the external connection terminal 175 is not particularly limited thereto. The external connection terminal 175 may be a land, a ball, a pin, or the like. The external connection terminal 175 may be formed of a multilayer or a single layer. In a case in which the external connection terminal 175 is formed of the multilayer, the external connection terminal 175 may contain a copper pillar and solder, and in a case in which the external connection terminal 175 is formed of the single layer, the external connection terminal 175 may contain tin-silver solder or copper. However, these cases are only examples, and the external connection terminal 175 is not limited thereto.

Meanwhile, unlike that illustrated in FIGS. 8 and 9, the electronic component package 100C according to another example may also be modified in a form in which a characteristic form of the electronic component package 100B described above is applied. Further, since a method of manufacturing the electronic component package 100C according to another example is the same as that of the electronic component package 100A described above except for forming the penetration wiring 130 in the frame 110 in advance and patterning the second and third metal layers 112B and 112A, etc., a description thereof will be omitted.

Figure 10:
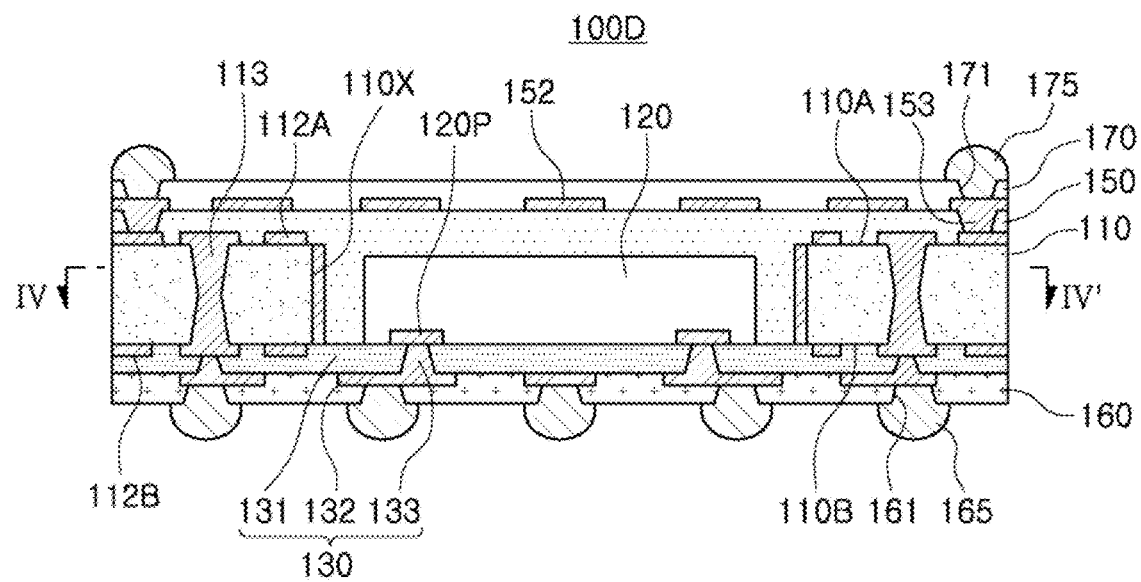
FIG. 10 is a cross-sectional diagram schematically illustrating another example of the electronic component package.

FIG. 10 is a cross-sectional diagram schematically illustrating another example of the electronic component package.

Figure 11:
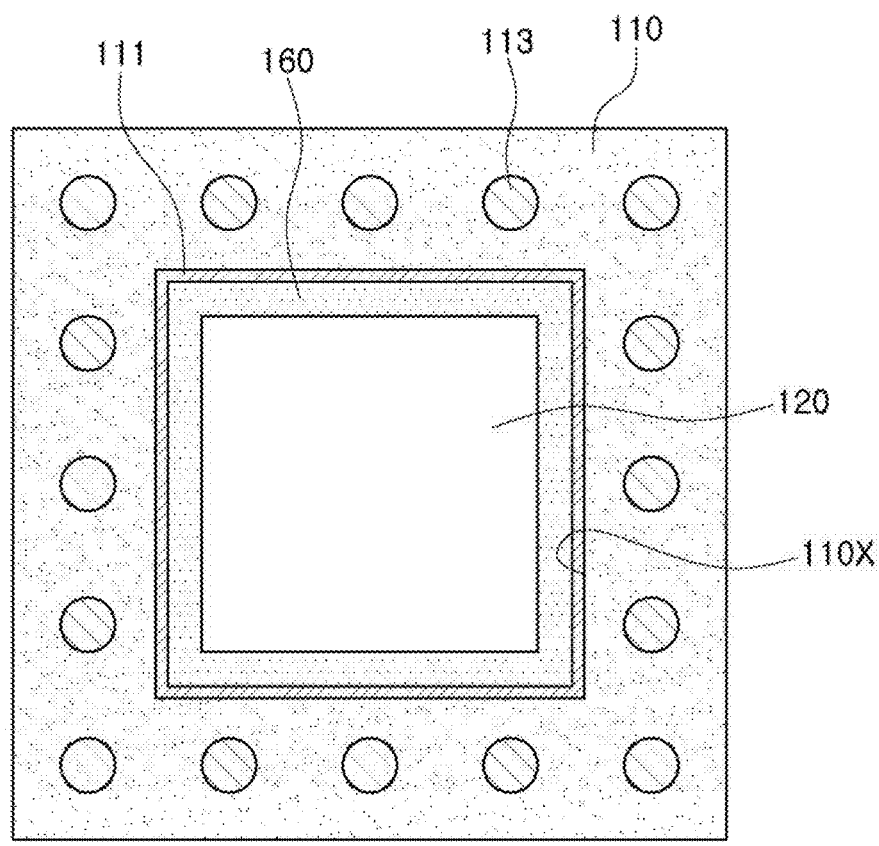
FIG. 11 is a schematic cut-away plan diagram of the electronic component package taken along line IV-IV' of FIG. 10.

FIG. 11 is a schematic cut-away plan diagram of the electronic component package taken along line IV-IV' of FIG. 10.

Referring to FIGS. 10 and 11, an electronic component package 100D according to another example may further include a penetration wiring 113 penetrating through a frame 110, and second and third metal layers 112B and 112A disposed on lower and upper surfaces 110B and 110A of the frame 110 may be patterned. In addition, the electronic component package 100D may include an outer edge conductive pattern 152 disposed on the encapsulant 150, and an outer edge conductive via 153 partially penetrating through the encapsulant 150. Hereinafter, each of the configurations included in the electronic component package 100D according to another example will be described in more detail, but a description overlapping the description described above will be omitted, and a difference therebetween will be mainly described.

Similarly, the number, an interval, a disposition shape, and the like, of penetration wiring 113 penetrating through the upper and lower surfaces 110A and 110B of the frame 110 are not particularly limited, and may be sufficiently changed by a person skilled in the art depending on a design. For example, the penetration wiring 113 may be disposed on the entire surface of the frame 110 as illustrated in FIG. 11 depending on a shape of another package mounted on the electronic component package 100D. Unlike this, the penetration wiring 113 may be disposed only in a specific region of the frame 110.

The outer edge conductive pattern 152 disposed on the encapsulant 150 may serve as a redistribution pattern, and as a material for forming the outer edge conductive pattern 152, a conductive material such as copper (Cu), aluminum (Al), silver (Ag), tin (Sn), gold (Au), nickel (Ni), lead (Pb), an alloy thereof, or the like, may be used. A specific example is as described above. The outer edge conductive pattern 152 may perform various functions depending on a design of the corresponding layer. For example, the outer edge conductive pattern 152 may perform a role of aground (GND) pattern, a power (PWR) pattern, a signal (S) pattern, or the like. Here, the signal (S) pattern may include various signal patterns, for example, a data signal pattern, or the like, except for the ground (GND) pattern, the power (PWR)

pattern, and the like. Further, the outer edge conductive pattern 152 may perform a role of a via pad, an external connection terminal pad, or the like. The outer edge conductive pattern 152 may be disposed on the entire surface of the encapsulant 150, and an external connection terminal 175 may also be disposed on an entire surface of a cover layer 170 to be described below in accordance with the outer edge conductive pattern 152, and thus the electronic component package may be variously designed. A thickness of the outer edge conductive pattern 152 is also not particularly limited. For example, each of the outer edge conductive patterns 152 may have a thickness of 10 µm to 50 µm or so. If necessary, the outer edge conductive pattern 152 may be disposed to substantially mostly cover an upper region of the electronic component 120 based on an area of a plane occupied by the electronic component 120. In this case, since all surfaces of the electronic component 120 are enclosed by conductive ingredients, electromagnetic waves may be effectively shielded.

The outer edge conductive via 153 partially penetrating the encapsulant 150 may be electrically connected conductive patterns 112A and 152 formed on different layers from each other, thereby forming an electrical path in the package 100D. A conductive material such as copper (Cu), aluminum (Al), silver (Ag), tin (Sn), gold (Au), nickel (Ni), lead (Pb), an alloy thereof, or the like, may also be used as a material for forming the outer edge conductive via 153. The outer edge conductive via 153 may be completely filled with the conductive material, or the conductive material may be formed on a wall of the via. Further, all shapes known in the art, such as a tapered shape of which a diameter is decreased downwardly, a reversely tapered shape of which a diameter is increased downwardly, a cylindrical shape, and the like, may be applied to the outer edge conductive via 153.

The electronic component package 100D according to another example may further include a cover layer 170 disposed on the encapsulant 150. The cover layer 170 may be a configuration for protecting the encapsulant 150, the outer edge conductive pattern 152, and the like, from external physical or chemical damages, or the like. The cover layer 170 may have an opening 171 at least partially exposing the outer edge conductive pattern 152 disposed on the encapsulant 150. The opening 171 may expose one surface of a portion of the outer edge conductive patterns 152, but in some cases, the opening 171 may expose a side surface thereof. A material of the cover layer 170 is not particularly limited. For example, a solder resist may be used. In addition, various PID resins may be used. If necessary, the cover layer 170 may be composed of a plurality of layers.

The electronic component package 100D according to another example may further include an external connection terminal 175 disposed in the opening 171 of the cover layer 170. The external connection terminal 175 may be disposed in the opening 171 and connected to the outer edge conductive pattern 152 exposed to the opening 171. The external connection terminal 175 may be formed of a conductive material, for example, copper (Cu), aluminum (Al), silver (Ag), tin (Sn), gold (Au), nickel (Ni), lead (Pb), solder, or the like. However, these materials are only examples, and the material of the external connection terminal 175 is not particularly limited thereto. The external connection terminal 175 may be a land, a ball, a pin, or the like. The external connection terminal 175 may be formed of a multilayer or a single layer. In a case in which the external connection terminal 175 is formed of the multilayer, the external connection terminal 175 may contain a copper pillar and solder, and in a case in which the external connection terminal 175 is formed of the single layer, the external connection terminal 175 may contain tin-silver solder or copper. However, these cases are only examples, and the external connection terminal 175 is not limited thereto. If necessary, various separate passive components (not illustrated) may also be disposed in the openings 171.

Meanwhile, unlike that illustrated in FIGS. 10 and 11, the electronic component package 100D according to another example may also be modified in a form in which a characteristic form of the electronic component package 100B described above is applied. Further, since a method of manufacturing the electronic component package 100D according to another example is the same as the method of manufacturing the electronic component package 100A described above except for forming the outer edge conductive pattern 152, the outer edge conductive via 153, etc., a description thereof will be omitted.

Figure 12:
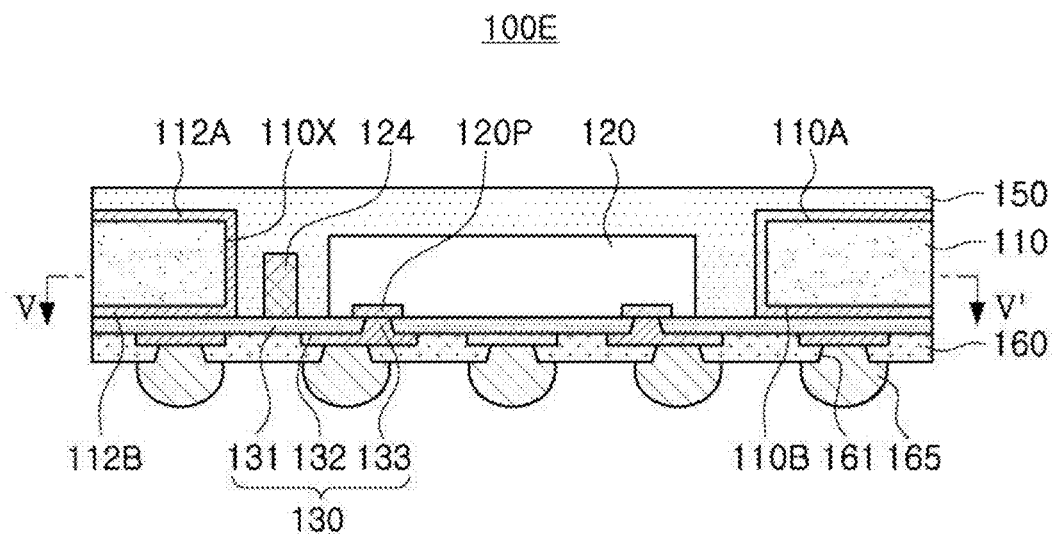
FIG. 12 is a cross-sectional diagram schematically illustrating another example of the electronic component package.

FIG. 12 is a cross-sectional diagram schematically illustrating another example of the electronic component package.

Figure 13:
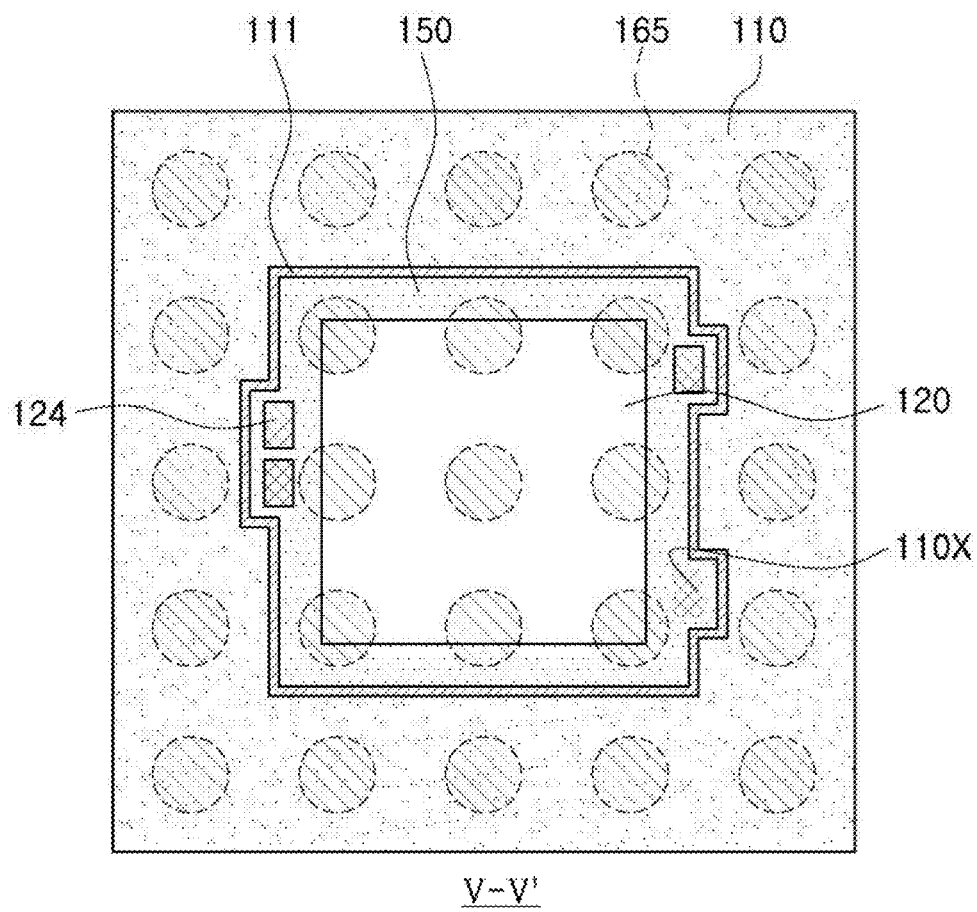
FIG. 13 is a schematic cut-away plan diagram of the electronic component package taken along line V-V' of FIG. 12.

FIG. 13 is a schematic cut-away plan diagram of the electronic component package taken along line V-V' of FIG. 12. Referring to FIGS. 12 and 13, in an electronic component package 100E according to another example, among electronic components 120 and 124, at least one may be an integrated circuit 120, and at least another may be a passive component 124. Hereinafter, each of the configurations included in the electronic component package 100E according to another example will be described in more detail, but a description overlapping the description described above will be omitted, and a difference therebetween will be mainly described.

The integrated circuit 120 may be a chip in which at least hundreds to millions or more of various elements are integrated with each other. For example, the integrated circuit 120 may be an application processor chip such as a central processor (for example, a central processing unit (CPU)), a graphics processor (for example, a graphics processing unit (GPU)), a digital signal processor, a cryptographic processor, a micro processor, a micro controller, or the like, but is not limited thereto. The passive component 124 may be, for example, an inductor, a condenser, a resistor, or the like, but is not limited thereto. The integrated circuit 120 may be electrically connected to a redistribution layer 130 through an electrode pad 120P. The passive component 124 may be electrically connected to the redistribution layer through an electrode pad (not illustrated), for example, an external electrode.

The numbers, intervals, disposition shapes, and the like, of the integrated circuit 120 and the passive component 124 are not particularly limited, and may be sufficiently changed by a person skilled in the art depending on a design. For example, the integrated circuit 120 may be disposed in the vicinity of the center of a cavity 110X, and the passive component 124 may be disposed in the vicinity of an inner wall of the cavity 110X, but the integrated circuit 120 and the passive component 124 are not limited thereto. In addition, only a single integrated circuit 120 may be disposed, and a plurality of passive components 124 may be disposed. However, the integrated circuit 120 and the passive component 124 are not limited thereto. That is, a plurality of integrated circuits 120 and a single passive component 124 may be disposed. Alternatively, only a single integrated circuit 120 and a single passive component 124 may also be disposed, or a plurality of integrated circuits 120 and a plurality of passive components may also be disposed.

Meanwhile, unlike that illustrated in FIGS. 12 and 13, the electronic component package 100E according to another example may also be modified in a form in which characteristic forms of the electronic component packages 100B to 100D described above are applied. Further, since a method of manufacturing the electronic component package 100E according to another example is the same as the method of manufacturing the electronic component package 100A described above except for disposing the integrated circuit 120 and the passive component 124 together with each other as the electronic components 120 and 124, etc., a description thereof will be omitted.

Figure 14:
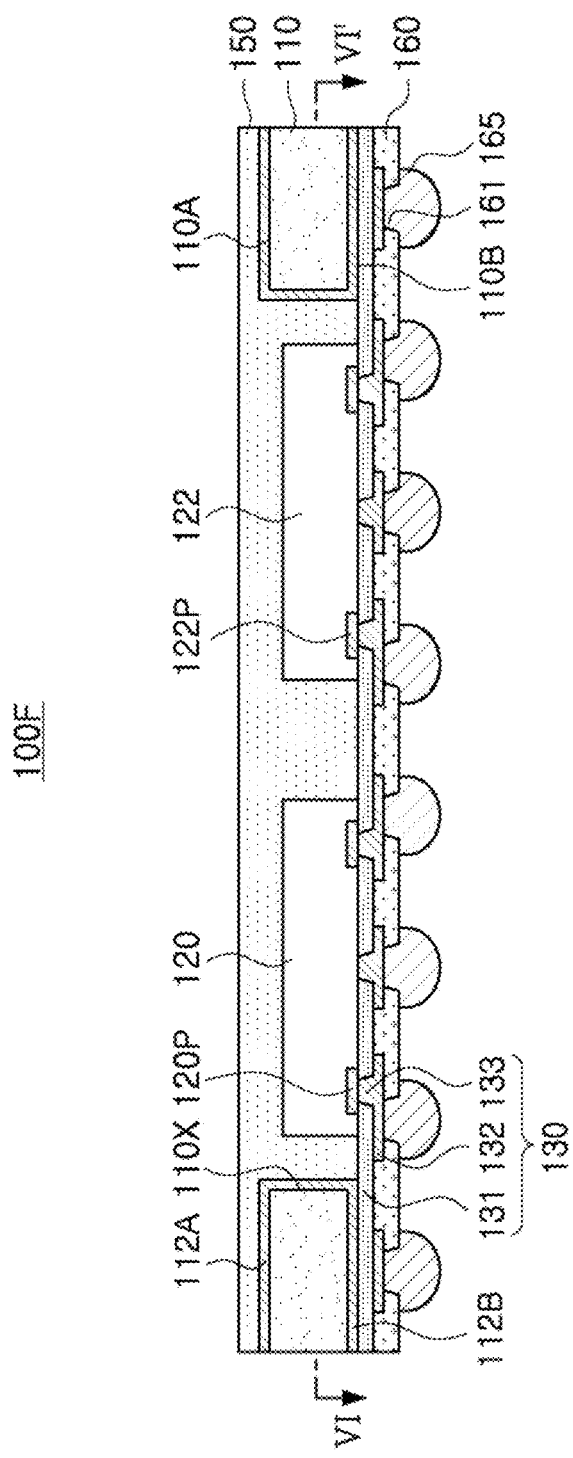
FIG. 14 is a cross-sectional diagram schematically illustrating another example of the electronic component package.

FIG. 14 is a cross-sectional diagram schematically illustrating another example of the electronic component package.

Figure 15:
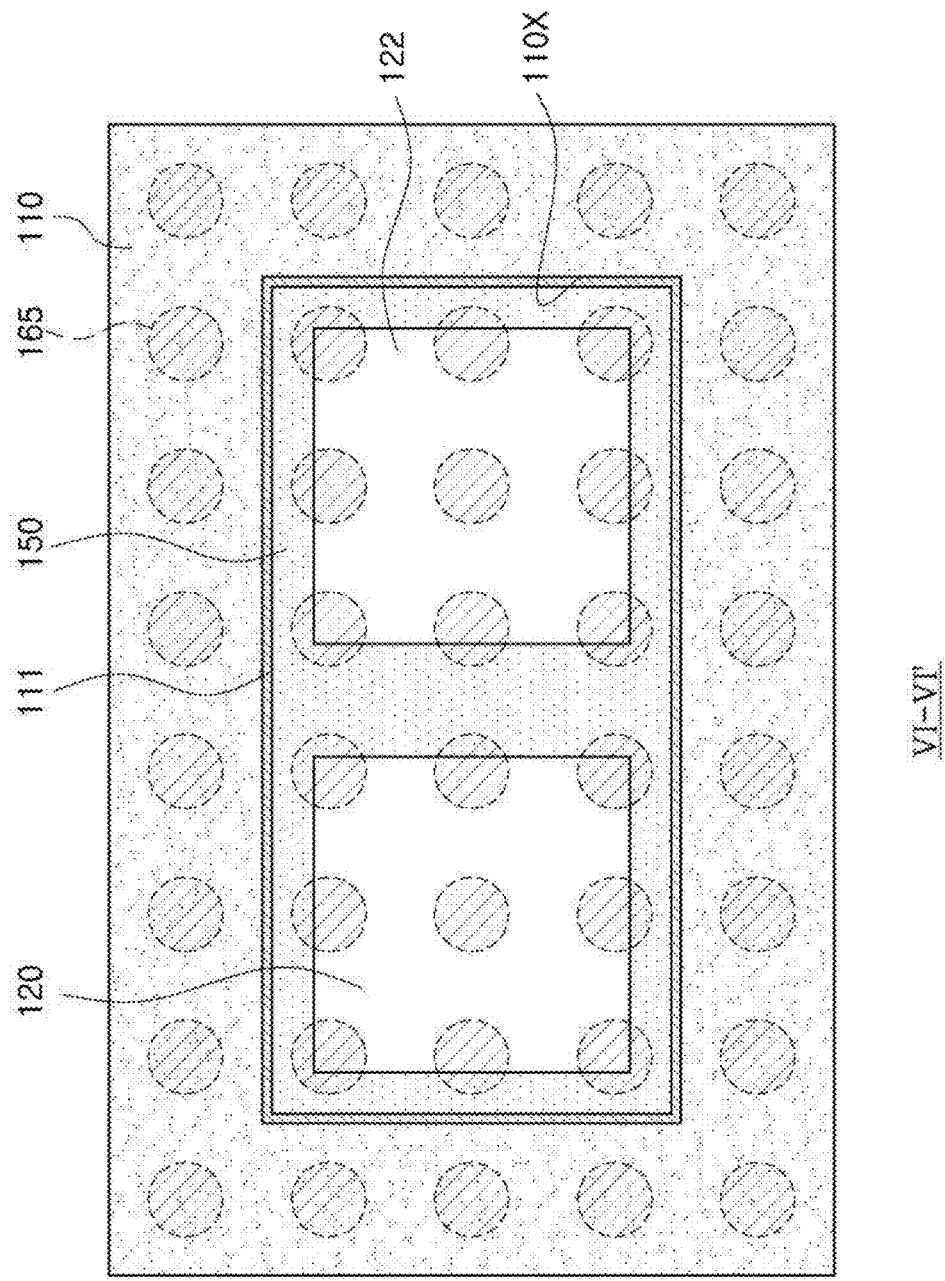
FIG. 15 is a schematic cut-away plan diagram of the electronic component package taken along line VI-VI' of FIG. 14.

FIG. 15 is a schematic cut-away plan diagram of the electronic component package taken along line VI-VI' of FIG. 14.

Referring to FIGS. 14 and 15, an electronic component package 100F according to another example may include a plurality of electronic components 120 and 122. Hereinafter, each of the configurations included in the electronic component package 100F according to another example will be described in more detail, but a description overlapping the description described above will be omitted, and a difference therebetween will be mainly described.

The plurality of electronic components 120 and 122 may be the same as or different from each other. The plurality of electronic components 120 and 122 may include electrode pads 120P and 122P electrically connected to a redistribution layer 130, respectively. The electrode pads 120P and 122P may be redistributed by the redistribution layer 130, respectively. The numbers, intervals, disposition shapes, and the like, of the plurality of electronic components 120 and 122 are not particularly limited, and may be sufficiently changed by a person skilled in the art depending on a design. For example, the number of plurality of electronic components 120 and 122 may be two as illustrated in FIGS. 14 and 15, but is not limited thereto. That is, three, four, or more electronic components may be disposed.

Meanwhile, unlike that illustrated in FIGS. 14 and 15, the electronic component package 100F according to another example may also be modified in a form in which characteristic forms of the electronic component packages 100B to 100E described above are applied. Further, since a method of manufacturing electronic component package 100F according to another example is the same as the method of manufacturing the electronic component package 100A described above except for disposing the plurality of electronic components 120 and 122, etc., a description thereof will be omitted.

Figure 16:
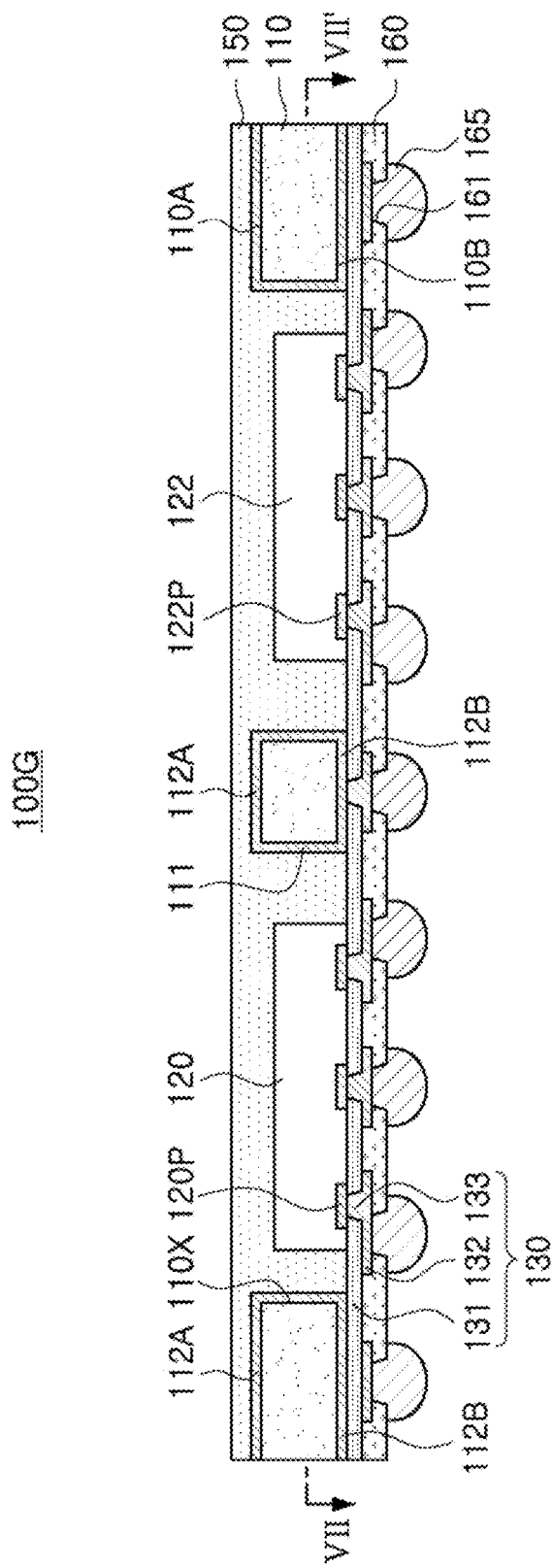
FIG. 16 is a cross-sectional diagram schematically illustrating another example of the electronic component package.

FIG. 16 is a cross-sectional diagram schematically illustrating another example of the electronic component package.

Figure 17:
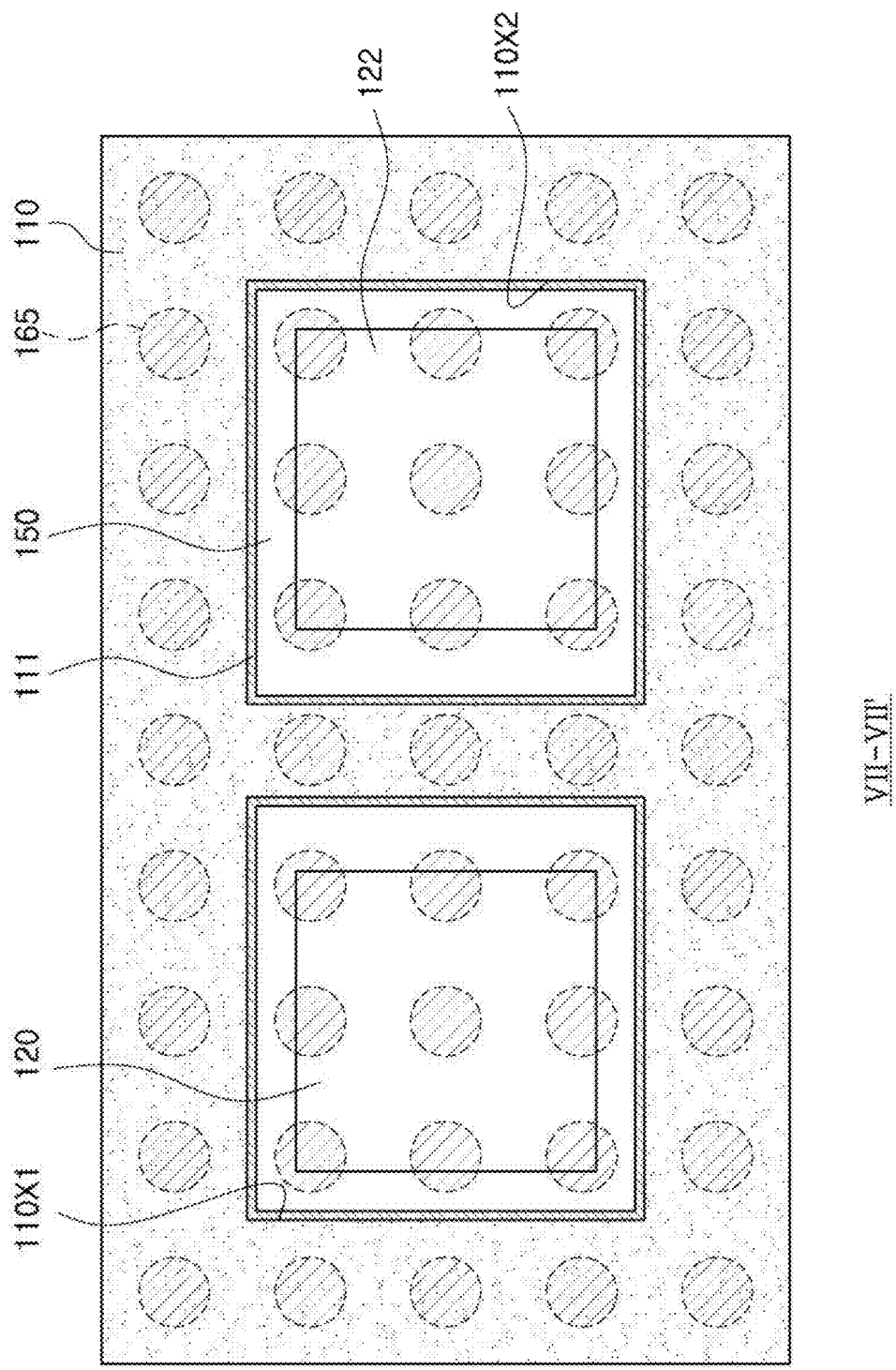
FIG. 17 is a schematic cut-away plan diagram of the electronic component package taken along line VII-VII' of FIG. 16.

FIG. 17 is a schematic cut-away plan diagram of the electronic component package taken along line VII-VII' of FIG. 16.

Referring to FIGS. 16 and 17, an electronic component package 100G according to another example may include a plurality of cavities 110X1 and 110X2, and electronic components 120 and 122 may be disposed in the cavities 110X1 and 110X2, respectively. Hereinafter, each of the configurations included in the electronic component package 100G according to another example will be described in more detail, but a description overlapping the description described above will be omitted, and a difference therebetween will be mainly described.

Areas, shapes, or the like, of the plurality of cavities 110X1 and 110X2 may be the same as or different from each other, and the electronic components 120 and 122 disposed in the cavities 110X1 and 110X2, respectively, may also be the same as or different from each other. The numbers, intervals, disposition shapes, and the like, of the plurality of cavities 110X1 and 110X1 and the electronic components 120 and 122 disposed therein, respectively, are not particularly limited, and may be sufficiently changed by a person skilled in the art depending on a design. For example, the number of plurality of cavities 110X1 and 110X2 may be two as illustrated in FIGS. 16 and 17, but is not limited thereto. That is, the number of plurality of cavities 110X1 and 110X2 may be three, four, or more. Further, the number of electronic components 120 and 122 disposed in the cavities 110X1 and 110X2, respectively, may be one as illustrated in FIGS. 16 and 17, but is not limited thereto. That is, the number of electronic components 120 and 122 may be two, three, or more.

Meanwhile, unlike that illustrated in FIGS. 16 and 17, the electronic component package 100G according to another example may also be modified in a form in which characteristic forms of the electronic component packages 100B to 100F described above are applied. Further, since a method of manufacturing the electronic component package 100G according to another example is the same as the method of manufacturing the electronic component package 100A described above except for forming the plurality of cavities 110X1 and 110X2, and then disposing the electronic components 120 and 122 therein, respectively, etc., a description thereof will be omitted.

Figure 18:
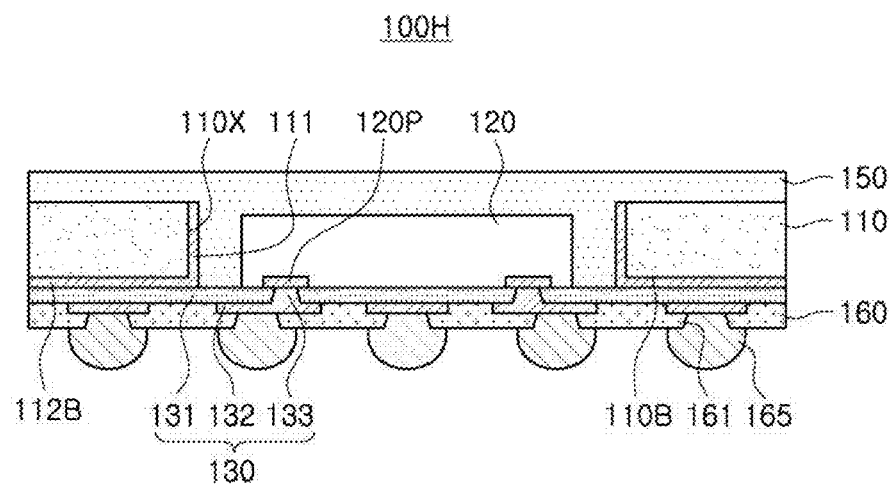
FIG. 18 is a cross-sectional diagram schematically illustrating another example of the electronic component package.

FIG. 18 is a cross-sectional diagram schematically illustrating another example of the electronic component package.

Referring to FIG. 18, in an electronic component package 100H according to another example, metal layers 111 and 112B may be disposed only on an inner wall of a cavity 110X and a lower surface 110B of a frame 110. Hereinafter, each of the configurations included in the electronic component package 100H according to another example will be described in more detail, but a description overlapping the description described above will be omitted, and a difference therebetween will be mainly described.

In some cases, a metal layer 112A may not also be disposed on an upper surface 110A of the frame 110 as in the electronic component package 100H according to another example. However, only when the metal layers 111 and 112B are disposed on the inner wall of the cavity 110X and the lower surface 110B of the frame 110 may a heat radiation effect and an electromagnetic wave shielding effect be sufficiently obtained.

Meanwhile, unlike that illustrated in FIG. 18, the electronic component package 100H according to another example may also be modified in a form in which characteristic forms of the electronic component package 100B to 100G described above are applied. Further, since a method of manufacturing the electronic component package 100H according to another example is the same as the method of manufacturing the electronic component package 100A described above except that the metal layer 112A is not formed on the upper surface 110A of the frame 110, etc., a description thereof will be omitted.

Figure 19:
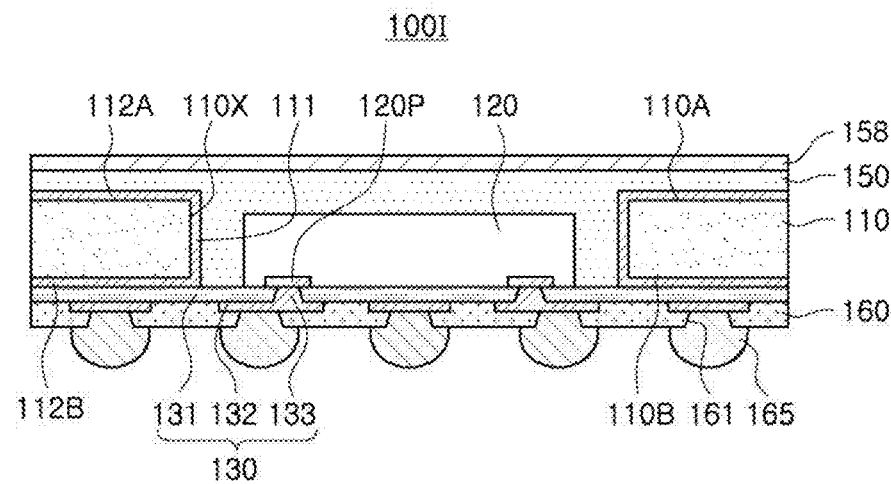
FIG. 19 is a cross-sectional diagram schematically illustrating another example of the electronic component package.

FIG. 19 is a cross-sectional diagram schematically illustrating another example of the electronic component package.

Referring to FIG. 19, an electronic component package 100I according to another example may further include a metal layer 158 disposed on an encapsulant 150. Hereinafter, each of the configurations included in the electronic component package 100I according to another example will be described in more detail, but a description overlapping the description described above will be omitted, and a difference therebetween will be mainly described.

In a case in which the electronic component package 100I has the metal layer 158, heat radiation characteristics and electromagnetic wave shielding characteristics may be further improved. As a material for forming the metal layer 158, any conductive material may be used without particular limitation. As the conductive material, similarly, copper (Cu), aluminum (Al), silver (Ag), tin (Sn), gold (Au), nickel (Ni), lead (Pb), an alloy thereof, or the like, may be used, but the conductive material is not limited thereto.

Meanwhile, unlike that illustrated in FIG. 19, the electronic component package 100I according to another example may also be modified in a form in which characteristic forms of the electronic component package 100B to 100H described above are applied. Further, since a method of manufacturing the electronic component package 100I according to another example is the same as the method of manufacturing the electronic component package 100A described above except for forming the metal layer 158 on the encapsulant 150, etc., a description thereof will be omitted.

Figure 20:
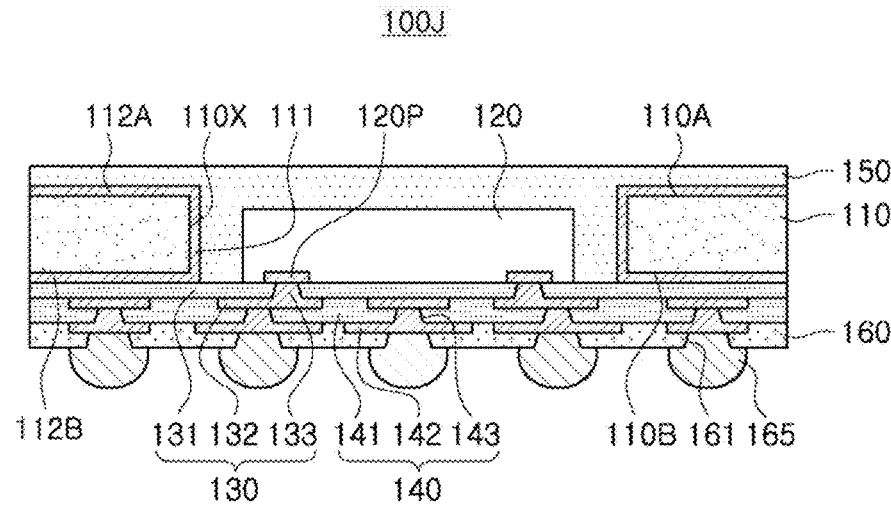
FIG. 20 is a cross-sectional diagram schematically illustrating another example of the electronic component package.

FIG. 20 is a cross-sectional diagram schematically illustrating another example of the electronic component package.

Referring to FIG. 20, in an electronic component package 100J according to another example, redistribution layers 130 and 140 may be composed of a plurality of layers. Hereinafter, each of the configurations included in the electronic component package 100J according to another example will be described in more detail, but a description overlapping the description described above will be omitted, and a difference therebetween will be mainly described.

The redistribution layers 130 and 140 may be composed of a plurality of layers depending on the kind of electronic component, and unlike that illustrated in FIG. 20, the redistribution layers 130 and 140 may be composed of two or more layers. The redistribution layers 130 and 140 may include insulating layers 131 and 141, conductive patterns 132 and 142, and a conductive via 133, respectively. Since a description of the redistribution layers 130 and 140 is the same as described above, the description thereof will be omitted.

Meanwhile, unlike that illustrated in FIG. 20, the electronic component package 100J according to another example may also be modified in a form in which characteristic forms of the electronic component packages 100B to 100I described above are applied. Further, since a method of manufacturing the electronic component package 100J according to another example is the same as the method of manufacturing the electronic component package 100A described above except that the redistribution layers 130 and 140 are composed of the plurality of layers, etc., a description thereof will be omitted.

Figure 21:
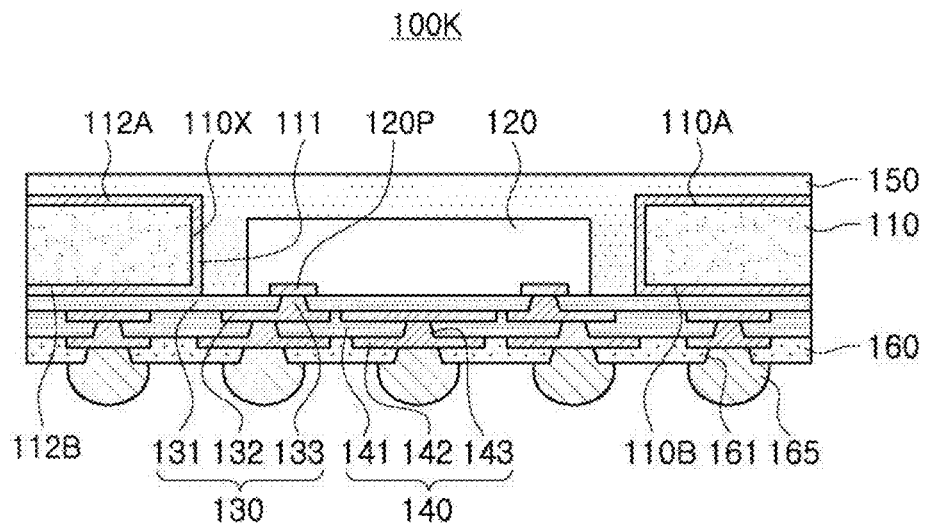
FIG. 21 is a cross-sectional diagram schematically illustrating another example of the electronic component package.

FIG. 21 is a cross-sectional diagram schematically illustrating another example of the electronic component package.

Referring to FIG. 21, in an electronic component package 100K according to another example, some of conductive patterns 132 and 142 included in redistribution layers 130 and 140 may be disposed to substantially mostly cover a lower region of the electronic component 120 based on an area of a plane occupied by an electronic component 120. Hereinafter, each of the configurations included in the electronic component package 100K according to another example will be described in more detail, but a description overlapping the description described above will be omitted, and a difference therebetween will be mainly described.

Some of the conductive patterns 132 and 142 disposed to substantially mostly cover the lower region of the electronic component 120 based on the area of the plane occupied by the electronic component 120 may be a ground (GND) pattern or a dummy pattern. However, in any case, since all surfaces of the electronic components 120 are enclosed by conductive ingredients, an electromagnetic wave may be effectively shielded.

Meanwhile, unlike that illustrated in FIG. 21, the electronic component package 100K according to another example may also be modified in a form in which characteristic forms of the electronic component packages 100B to 100J described above are applied. Further, since a method of manufacturing the electronic component package 100K according to another example is the same as the method of manufacturing the electronic component package 100A described above except that some of the conductive patterns 132 and 142 included in the redistribution layers 130 and 140 are disposed to substantially cover all of the lower region of the electronic component 120 based on the area of the plane occupied by the electronic component 120, etc., a description thereof will be omitted.

Figure 22:
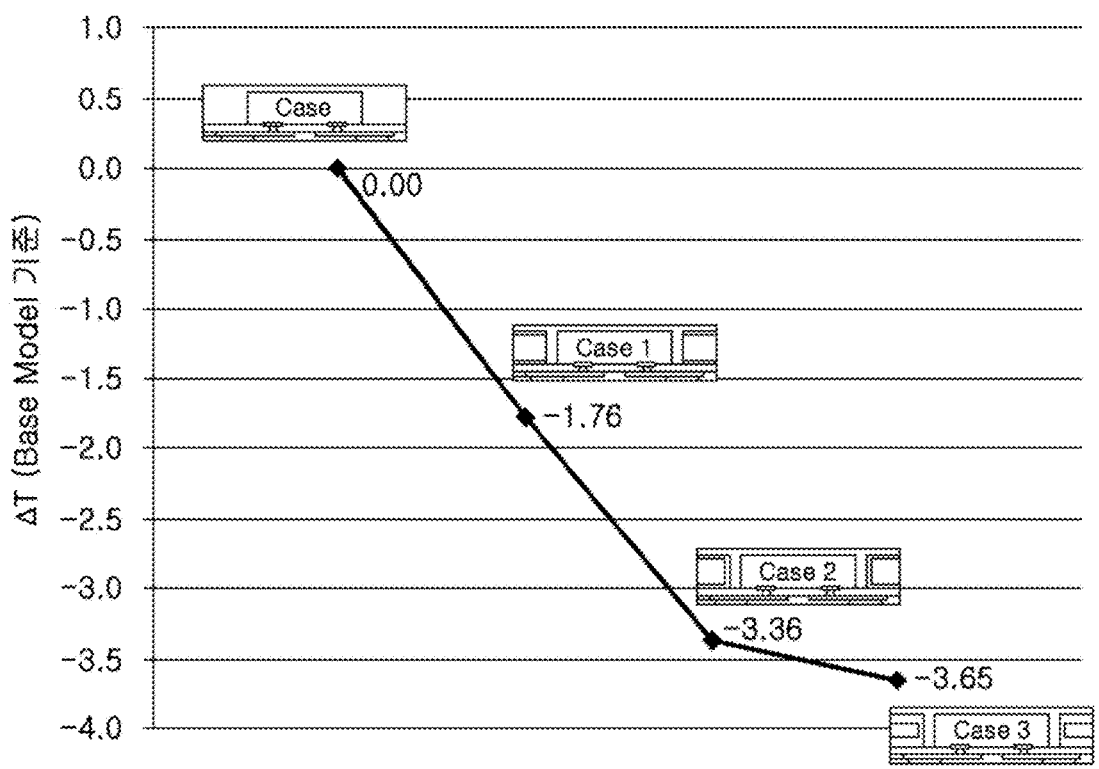
FIG. 22 illustrates heat radiation simulation results of various electronic component packages.

FIG. 22 illustrates heat radiation simulation results of various electronic component packages.

Figure 23:
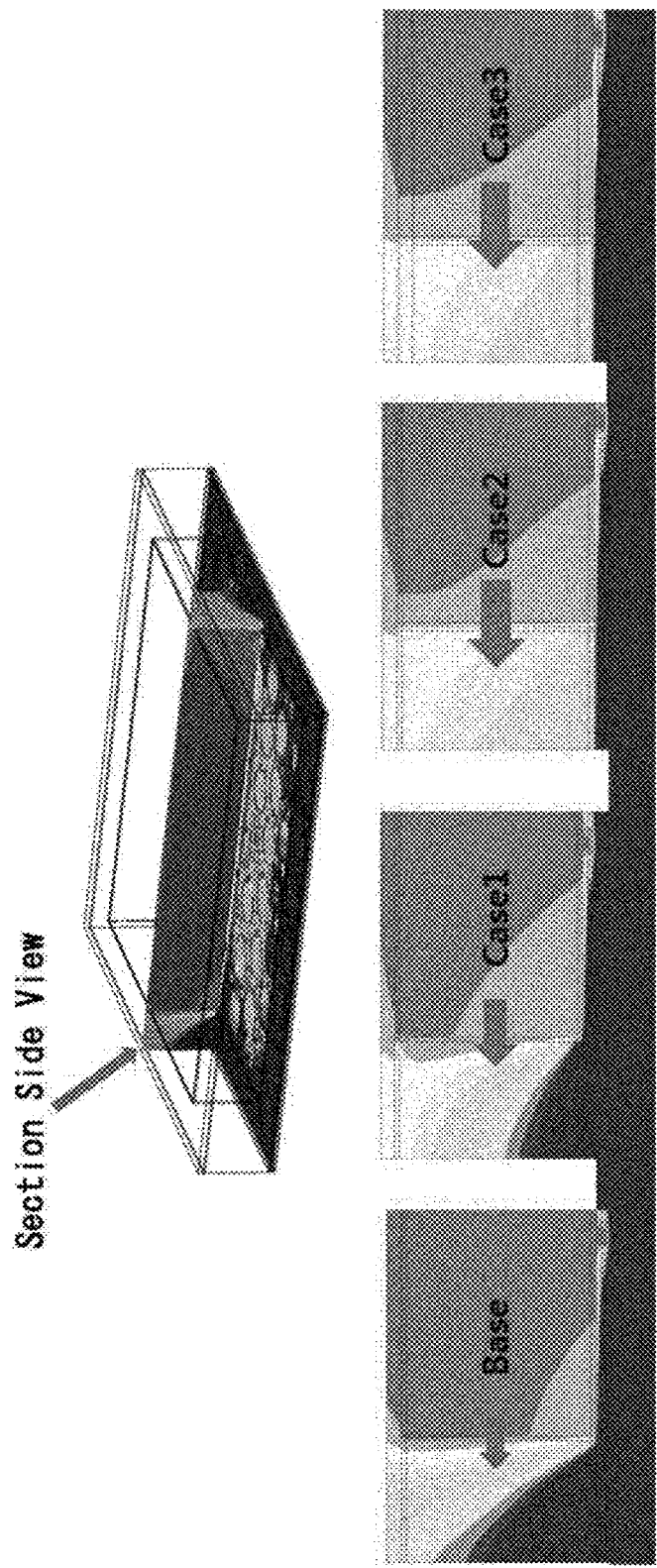
FIG. 23 illustrates temperature-cross sectional area distribution of the electronic component packages of FIG. 22.

FIG. 23 illustrates temperature-cross sectional area distribution of the electronic component packages of FIG. 22.

A base model is a case in which an electronic component is simply encapsulated with an encapsulant, case 1 is a case in which a frame is introduced, but metal layers are disposed on upper and lower surfaces of the frame, case 2 is a case in which a metal layer is also disposed on an inner wall of a cavity, and case 3 is a case in which a thickness of the metal layers disposed on the upper and lower surfaces of the frame is increased from 10 μm to 30 μm. As illustrated in FIG. 22, it may be appreciated that a heat radiation effect may be further increased in a direction from the base model toward case 3. That is, it may be appreciated that heat may be more easily diffused. Further, it may be appreciated that particularly in a case in which a thickness of the metal layer is 30 μm or more, the heat radiation effect may be excellent.

As set forth above, according to exemplary embodiments in the present disclosure, the electronic component package capable of solving various problems caused by heat generation and electromagnetic interference, and the method of manufacturing the same to efficiently manufacture the electronic component package may be provided.

Meanwhile, in the present disclosure, the term 'connected to' includes that one component is not only directly connected to another component, but is also indirectly connected to another component through an adhesive, or the like. Meanwhile, the term 'electrically connected' includes both of a case in which one component is physically connected to another component and a case in which any component is not physically connected to another component. Meanwhile, in the present disclosure, terms "first", "second", and the like, are used to distinguish one component from another component, and do not limit a sequence, importance, and/or the like, of the corresponding components. In some cases, a first component may be named a second component, and a second component may also be similarly named a first component, without departing from the scope of the present disclosure.

Meanwhile, a term "example" used in the present disclosure does not mean the same example, but is provided in order to emphasize and describe different unit features. However, the above suggested examples may also be implemented to be combined with a feature of another example. For example, even though particulars described in a specific example are not described in another example, it may be understood as a description related to another example unless described otherwise.

Meanwhile, terms used in the present disclosure are used only in order to describe an example rather than limiting the present disclosure. Here, singular forms include plural forms unless a context clearly indicates otherwise.

While exemplary embodiments have been shown and described above, it will be apparent to those skilled in the art that modifications and variations could be made without departing from the scope of the present invention as defined by the appended claims.

What is claimed is:

1. An electronic component package comprising:
   a frame having a cavity;
   an electronic component disposed in the cavity of the frame;
   a first metal layer disposed on an inner wall of the cavity of the frame;
   a second metal layer disposed on a lower surface of the frame;
   a third metal layer disposed on an upper surface of the frame;
   a penetration wiring penetrating through the frame;
   an encapsulant encapsulating at least portion of the electronic component; and
   a redistribution layer disposed below the frame and the electronic component, wherein the second and third metal layers are redistribution patterns or dummy patterns.

2. The electronic component package of claim 1, wherein the first metal layer encloses around side surfaces of the electronic component.

3. The electronic component package of claim 2, wherein the first metal layer entirely covers the inner wall of the cavity of the frame.

4. The electronic component package of claim 1, wherein the second metal layer is connected to the first metal layer.

5. The electronic component package of claim 1, wherein the second metal layer entirely covers the lower surface of the frame.

6. The electronic component package of claim 1, wherein the third metal layer is connected to the first metal layer.

7. The electronic component package of claim 1, wherein the third metal layer entirely covers the upper surface of the frame.

8. The electronic component package of claim 1, further comprising:
   an external layer disposed below the redistribution layer and having an opening; and
   an external connection terminal disposed in the opening, wherein at least one external connection terminal is disposed in a fan-out region.

9. The electronic component package of claim 1, wherein the encapsulant fills a space in the cavity of the frame while covering upper portions of the frame and the electronic component.

10. The electronic component package of claim 9, wherein the encapsulant encloses outer side surfaces of the frame, and the frame is not externally exposed.

11. A method of manufacturing an electronic component package, the method comprising:
    preparing a frame having a cavity;
    forming a first metal layer on an inner wall of the cavity of the frame;
    forming a second metal layer on a lower surface of the frame;
    forming a third metal layer on an upper surface of the frame;
    forming a penetration wiring penetrating through the frame;
    disposing an electronic component in the cavity of the frame;
    forming an encapsulant encapsulating at least portion of the electronic component; and
    forming a redistribution layer below the frame and the electronic component, wherein the second and third metal layers are redistribution patterns or dummy patterns.

12. The method of claim 11,
    wherein the first to third metal layers are simultaneously formed.

* * * * *